US006097198A

United States Patent [19]

Oguro et al.

[11] Patent Number: 6,097,198

[45] Date of Patent: Aug. 1, 2000

[54] INSPECTION JIG

[75] Inventors: Hisasi Oguro, Tokyo; Kazuo Inoue, Tokorozawa, both of Japan

[73] Assignee: JSR Corporation, Tokyo, Japan

[21] Appl. No.: 09/002,915

[22] Filed: Jan. 5, 1998

[30] Foreign Application Priority Data

Jan. 10, 1997 [JP] Japan .................................... 9-002774

[51] Int. Cl.[7] ......................... G01R 31/28; G01R 31/319

[52] U.S. Cl. ........................... 324/755; 324/757; 324/758

[58] Field of Search .................................... 324/755, 758, 324/757

[56] References Cited

U.S. PATENT DOCUMENTS

| | | | |
|---|---|---|---|
| 5,108,305 | 4/1992 | Suzuki | 324/538 X |
| 5,127,837 | 7/1992 | Shah et al. | 439/71 |
| 5,517,125 | 5/1996 | Posedel et al. | 324/755 |
| 5,561,372 | 10/1996 | Watanabe et al. | 324/508 X |
| 5,621,328 | 4/1997 | Yamanshi | 324/538 |

FOREIGN PATENT DOCUMENTS

| | | |
|---|---|---|
| 0 681 186 | 11/1995 | European Pat. Off. . |
| 89583 | 3/1992 | Japan . |
| 159495 | 6/1995 | Japan . |

*Primary Examiner*—Thomas P. Noland
*Attorney, Agent, or Firm*—Oblon, Spivak, McClelland, Maier & Neustadt, P.C.

[57] ABSTRACT

While a depression body supporting portion having a depression body depressing an upper surface of a semiconductor element is guided and supported by a support shaft, after a slide member arranged on the upper surface of the depression body supporting portion is depressed toward the upper surface of the semiconductor element, the slide member is slid in one direction relative to the upper surface of the depression body supporting portion to engage an engaging piece of the slide member to a connecting portion of the support shaft for maintaining depressed condition by the depression body.

2 Claims, 26 Drawing Sheets

INSPECTION JIG

This application is based on patent application No. 09-002,774 filed Jan. 10, 1997 in Japan, the content of which is incorporated hereinto by reference.

BACKGROUND OF THE INVENTION

1. Field of the Invention

The present invention relates to an inspection jig to be used for nondestructive testing of an electronic circuit in an object under inspection which includes the electronic circuit therein.

2. Description of the Related Art

In a semiconductor integrated circuit mounted on electronic devices and the like, potential defects can be eliminated by performing various tests before mounting. The tests are performed in a non-destructive manner by application of voltage stress, operation under high temperature, storage under high temperature and the like corresponding to thermal and mechanical environment tests. Among various tests, as a test effective for rejecting an integrated circuit having initial operation failure, a burn in test, in which operation test is performed for a predetermined period under high temperature condition.

As shown in FIGS. 25 and 26, an inspection jig to be used in such burn in test includes a printed circuit board 2 arranged on a frame 6, is supplied a predetermined test voltage and having an input/output portion 2A outputting an abnormality detection signal indicative of shorting or other failure of an object under inspection, an object under inspection receptacle member 10 including a receptacle portion receiving a semiconductor integrated circuit as the object under inspection which is arranged at the predetermined position on the printed circuit board 2, which the receptacle portion receives a surface mounting QFP (quad flat package) type semiconductor element 12, for example, a cover member 8 having a contact portion 8*a* contacting with the upper surface of the semiconductor element 12 for depressing the latter with a predetermined pressure and covering the upper portion of the object under inspection receptacle member 10, and a hook member 16 engaging with both of the cover member 8 and the object under inspection receptacle member 10 for securing the cover member 8 on the object under inspection receptacle member 10.

One end portion of the cover member 8 is pivotably supported by a support shaft 10*a* provided on one edge portion of the object under inspection receptacle member 10 and thus is connected to the object under inspection receptacle member 10. By this, the cover member 8 is openably supported with respect to the object under inspection receptacle member 10 when the hook member 16 is in a condition disengaged from the cover member 8 and the object under inspection receptacle member 10.

On the other hand, in a portion of the internal surface side portion of the cover member 8 opposing to the semiconductor element 12, the contact portion 8*a* contacting with an outer shell of the semiconductor element 12 and downwardly depressing the latter with a predetermined pressure.

Respective terminals extending on every side from respective edges in the substantially square semiconductor element 12 loaded within the object under inspection receptacle member 10 are positioned in contact with respective connection terminals 2*a* of the printed circuit board 2. On the other hand, a portion of each connection terminal 2*a* contacting with the terminal of the semiconductor element 12 is formed into arc shaped configuration with elasticity.

Furthermore, each connection terminal 2*a* is connected to an input/output portion 2A via a printed wiring network which is neglected from illustration. By this, when the cover member 8 covers a receptacle chamber of the object under inspection receptacle member 10, each terminal of the semiconductor element 12 and each connection terminal 2*a* in the printing circuit board 2 are placed in electrically conducted state under action of a predetermined biasing force on each terminal in the semiconductor element 12.

With such construction, when the semiconductor element 12 is loaded within the object under inspection receptacle member 10, the cover member 8 is placed at closed condition and the hook member 16 is engaged to place each terminal of the semiconductor element 12 and each connection terminal 2*a* in the printing circuit board 2 in conducting state. Then, the predetermined testing voltage is supplied to the input/output portion 2A of the printed circuit board 2 to perform burn in test, for example.

When the tip end of each terminal and each connection terminal 2*a* in the printed circuit board 2 are contacted under the condition where a predetermined biasing force is acted on each terminal in the semiconductor device 12 as set forth above, since the cover member 8 is openably supported with respect to the object under inspection receptacle member 10, at first, the end edge portion of the contact portion 8*a* of the cover member 8 is contacted with a part of the upper surface as a depressed surface portion of the semiconductor element 12. And then, remaining contact surface in the contact portion 8*a* of the cover member 8 is contacted with other portion of the upper surface of the semiconductor element 12. In such case, when a part of the contact portion 8*a* is contacted on the outer shell of the semiconductor element 12 with offset, since the biasing force is not uniformly act on respective terminals, a shearing force may act on the contact surface between each terminal of the semiconductor element 12 and each connection terminal 2*a* of the printed circuit board 2 to possibly cause damage on the terminal of the semiconductor element 12 and to possibly cause difficulty in obtaining stable contacting state.

On the other hand, associating with increasing of density of the terminals of the semiconductor element 12, it is not easy to provide respective connection terminals 2*a* formed into arc shaped configuration and having elasticity, with a fine mutual interval on the printed circuit board 2 to cause high fabrication cost.

SUMMARY OF THE INVENTION

In view of the problems set forth above, it is an object of the present invention to provide an inspection jig to be used for non-destructive test of an electronic circuit in an object under inspection which has the electronic circuit therein, which can uniformly apply a pressure on respective terminals of a semiconductor element without action of unwanted shearing force on a contact surface between each terminal of the loaded semiconductor element and each terminal of the board, and which can easily perform test even for the semiconductor element having terminals arranged in high density.

In order to accomplish the above-mentioned object, in a first aspect of the present invention, there is an inspection jig comprising:

a board including a contact electrically connected to a terminal of an object under inspection which has an internal electronic circuit, and an input/output portion inputting an input signal and outputting an output signal;

a depression member having a contact portion contacting with a depressed surface portion in the object under inspection with a predetermined pressure for contacting the contact of the board onto the terminal of the object under inspection loaded on the board;

a support member supporting the depression member for permitting the contact portion of the depression member to move toward and away from the depressed surface portion along a direction substantially perpendicular to the depressed surface portion of the object under inspection which is arranged on the board; and a slide member having both ends of the depression member opposing the contact portion supported movably in a direction substantially parallel to the depressed surface portion in the object under inspection and selectively placing the contact portion between a depression condition and a depression released condition relative to the depressed surface portion in the object under inspection.

Here, an inspection jig may further comprise a selectively conducting board arranged between the contact of the board and the terminal of the object under inspection having a connecting portion provided corresponding to the contact of the board, and selectively conducting the terminal and the contact via the connecting portion.

In a second aspect of the present invention, there is provided an inspection jig comprising;

a board including a contact electrically connected to a terminal of an object under inspection which has an internal electronic circuit, and an input/output portion inputting an input signal and outputting an output signal;

a depression member having a contact portion contacting with a depressed surface portion in the object under inspection for contacting the contact of the board onto the terminal of the object under inspection loaded on the board;

a support member supporting the depression member for permitting the contact portion of the depression member to move toward and away from the depressed surface portion along a direction substantially perpendicular to the depressed surface portion of the object under inspection which is arranged on the board;

a slide member supported for movement of both ends of the depression member opposing the contact portion and in a direction substantially parallel to the depressed surface portion in the object under inspection under inspection and selectively placing the contact portion between a depression condition and a depression released condition relative to the depressed surface portion in the object under inspection; and depression force restricting portion arranged in opposition to the depression member and restricting depression force to be exerted on the contact portion of the depression member when the contact portion of the depression member contacts with the depressed surface portion of the object under inspection.

In a third aspect of the present invention, there is provided an inspection jig comprising:

a board including a contact electrically connected to a terminal of an object under inspection which has an internal electronic circuit, and an input/output portion inputting an input signal and outputting an output signal; and a selectively conducting board arranged between the contact of the board and the terminal of the object under inspection, having a connecting portion being provided in a contacted portion engaged with the terminal of the object under inspection corresponding to the contact of the board and the terminal of the object under inspection, for selectively communicating the terminal and the contact via the connecting portion.

As can be clear from the explanation given hereabove, with the inspection jig according to the present invention, the supporting member supporting the depressing member so that the contact portion of the depressing member moves toward and away from the depressed surface portion along a direction substantially perpendicular to the depressed surface portion of the object under inspection arranged on the printed circuit board upon uniformly exerting a pressure for a depressed surface portion of the object under inspection by a depressing member, and a slide member. The slide member is supported movably along a direction substantially parallel to the depressed surface portion in the object under inspection, at both ends of the portion corresponding to the contact portion in the depressing member so that the contact portion is selectively situated into the depressed position and the released position with respect to the depressed surface portion of the object under inspection. Thus, unwanted shearing force does not act on the contact surface of each terminal of the semiconductor element and the terminal of the printed circuit board and whereby to apply uniform pressure on respective terminals of the semiconductor element.

On the other hand, when a selective conducting printed circuit board disposed between the contact of the printed circuit board and the terminal of the object under inspection, having the contact portion corresponding to the terminal of the object under inspection, and the selectively conducting board selectively conducting the terminal and the contact via the contact portion, test can be easily performed even for the semiconductor element having the terminals arranged in high density.

Furthermore, when the contact portion of the depressing member is in contact with the depressed surface portion of the object under inspection, a pressure restricting portion restricting pressure in the contact portion of the depressing member, is arranged in opposition to the depressing member. Therefore, an allowable range of the pressure can be uniformly applied to respective terminals of the semiconductor element.

Then, the selective conducting printed circuit board to be arranged between the contact of the printed circuit board and the terminal of the object under inspection, is provided with the contact portion corresponding to the contact of the printed circuit board and the terminal of the object under inspection and has the contact portion with the engaged portion to be engaged with the terminal of the object under inspection. Since the terminal and the contact is selectively conducted via the connecting portion, positioning of respective terminal of the semiconductor element relative to the terminal of the board can be easily performed. In conjunction therewith, test can be easily performed even for the semiconductor element having the terminals arranged in high density.

The above and other objects, effects, features and advantages of the present invention will become more apparent from the following description of embodiments thereof taken in conjunction with the accompanying drawings.

DESCRIPTION OF THE PREFERRED EMBODIMENT

Figure 2:
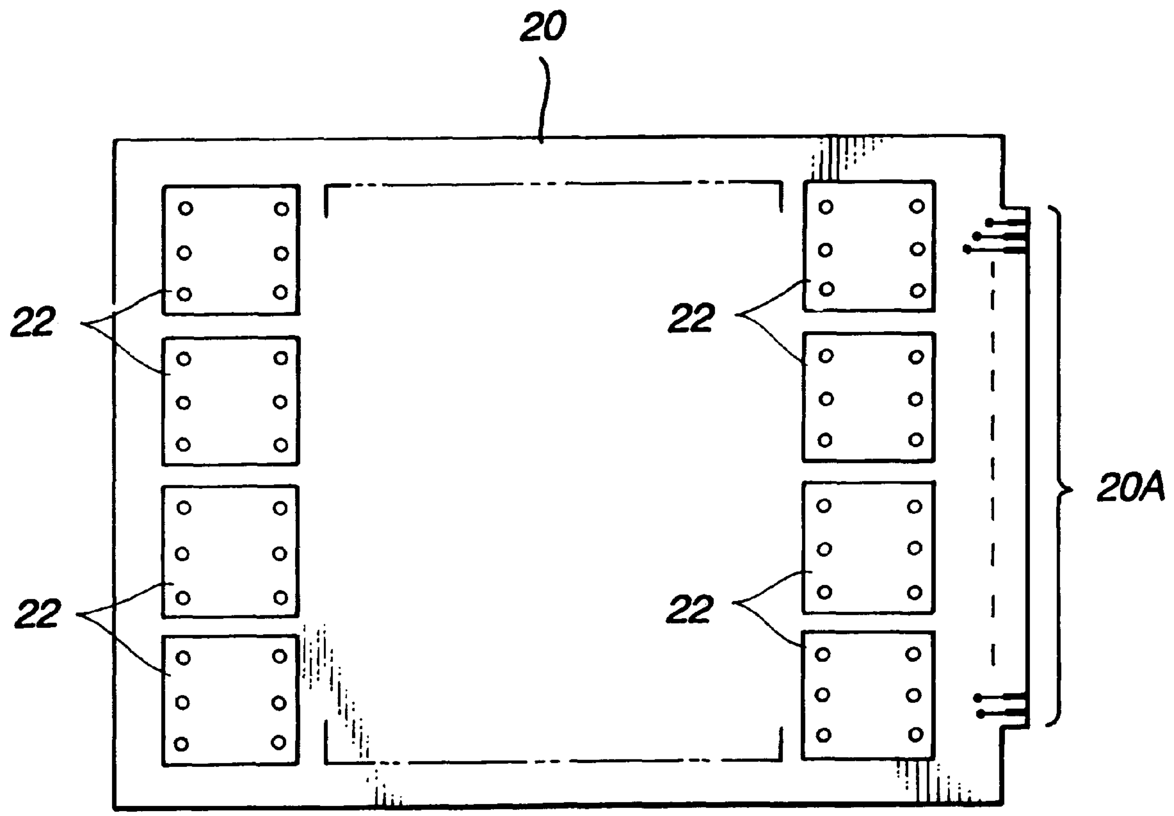
FIG. 2 is a plan view showing general construction of the first embodiment of the inspection jig according to the present invention.

FIG. 2 generally shows a construction of the first embodiment of an inspection jig according to the present invention. In FIG. 2, the first embodiment of the inspection jig is constructed with a printed circuit board 20 supplied a predetermined test voltage and having an input/output portion 20A transmitting an abnormality detection signal indicative of shorting or the like from an object under inspection, and a plurality of object under inspection receptacle members 22 arranged at predetermined positions in every direction on the printed circuit board 20 and having receptacle chambers, in which semiconductor elements as objects under inspection are loaded.

Figure 1:
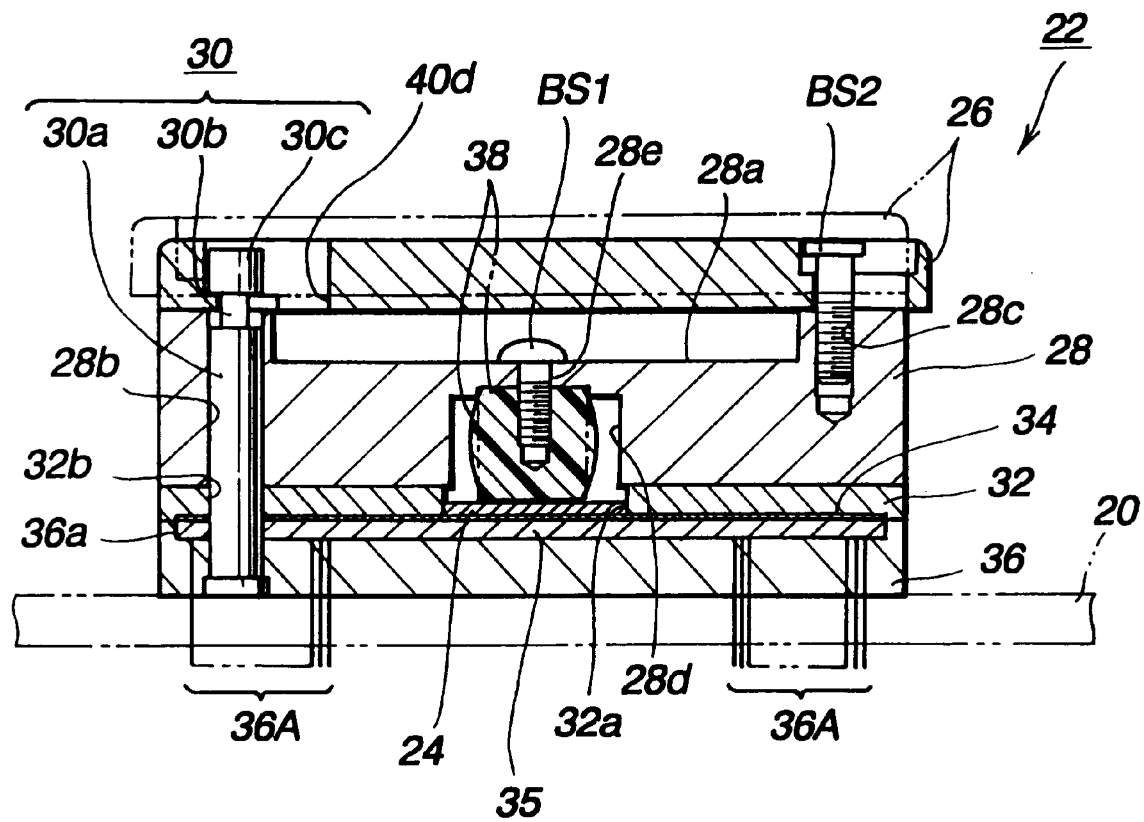
FIG. 1 is a section showing the major part of the first embodiment of an inspection jig according to the present invention.

As shown in FIG. 1, the semiconductor element 24 as the object under inspection is a substantially square shaped chip obtained by dividing a wafer, on which a plurality of semiconductor integrated circuits are formed, through a dicing process, for example. In the semiconductor element 24, on a surface opposing to a selectively conducting board 34 which will be explained later, a plurality of electrodes to be connected with terminal portions of the selectively conducting board 34, are formed along the entire periphery thereof.

As shown in FIG. 1, the object under inspection receptacle member 22 is constructed with a base 36 arranged at predetermined positions in the printed circuit board 20 having input/output terminal portions 36A respectively connected to respective terminal portions of the printed circuit board 20, the selectively conducting board 34 selectively conducting the input/output terminal portions 36A in a board portion 35 arranged within a recessed portion 36*a* formed in the upper portion of the base 36 and respective electrodes of the semiconductor elements 24, a positioning member 32 mounted on the upper edge portion of the base 36 and the upper surface of the selectively conducting board 34 for positioning of respective electrodes of the semiconductor elements 24 relative to the terminal portions of the selectively conducting board 34 and, in conjunction therewith, receiving the semiconductor element 24, a depression body supporting portion 28 arranged above the positioning member 32 in opposition thereto and having a depression body 38 depressing respective electrodes of the semiconductor elements 24 to the terminal portions of the selectively conducting board 34 and selectively movable toward and away from the positioning member 32 and a slide member 26 selectively placing the depression body 38 of the depression body supporting portion 28 between a depressing condition depressing the semiconductor element 24 and depression released condition shifted away from the semiconductor element 24.

Figure 4:
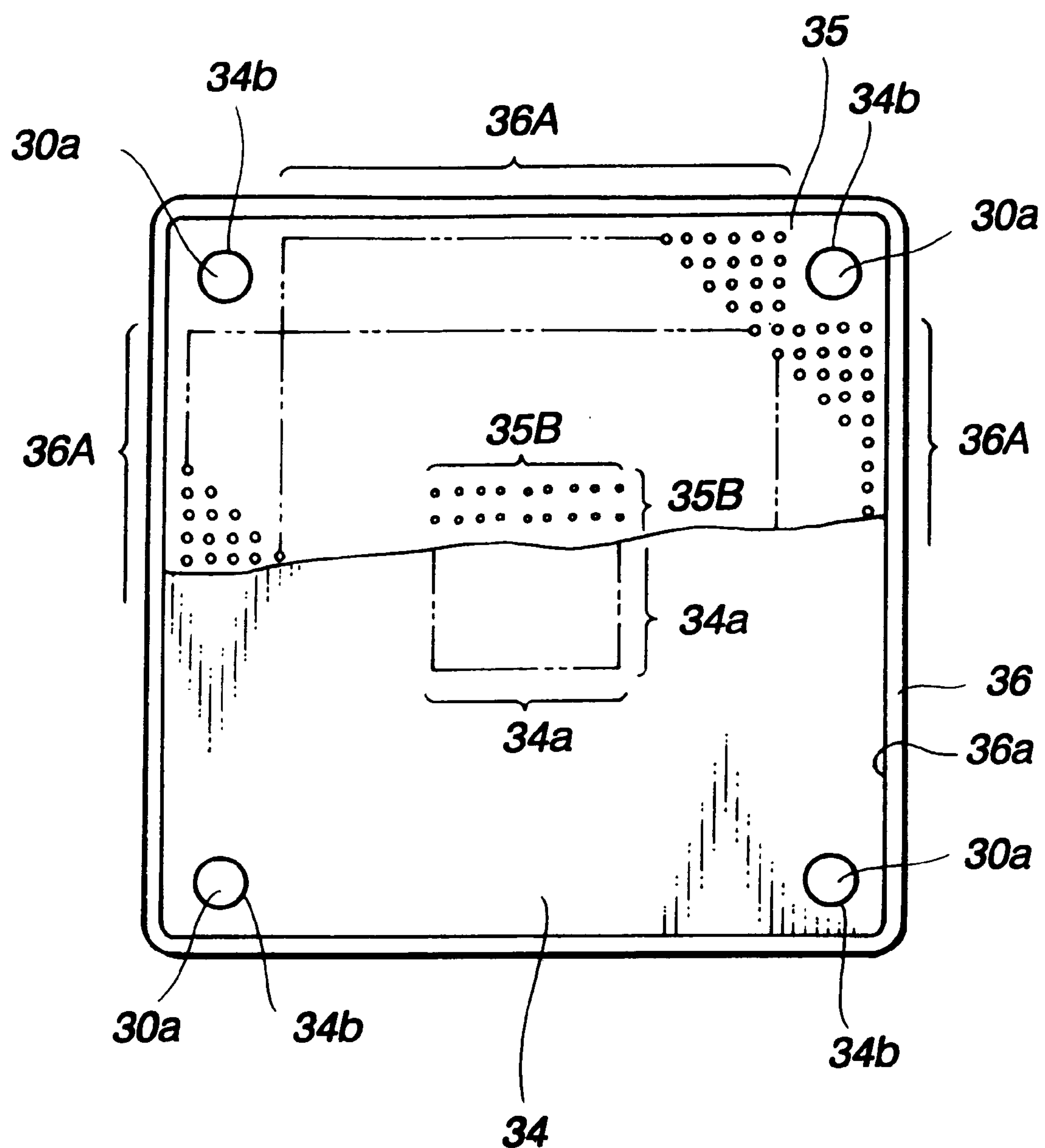
FIG. 4 is a plan view showing the major part in the embodiment shown in FIG. 3.

In the base 36, one end of the input/output terminal portions 36A formed of brass, beryllium copper or gold, for example, reaches a surface portion of the board portion 35 provided within the recessed portion 36*a* of the base 36 as shown in FIG. 4. The input/output terminal portion 36A is provided surrounding the entire peripheral edge portion of the recessed portion 36*a*. Respective terminals of the input/output terminal portions 36A are arranged in every direction with a predetermined mutual interval, e.g. about 1.7 mm.

On the other hand, in the center portion in the board portion 35, electrode group 35B contacting with the terminal portions of the selectively conducting board 34 is provided corresponding to the terminal portions of the selectively conducting board 34, as shown in FIG. 4. Respective electrodes in the electrode group 35 are connected to respective input/output terminal portions 36A through a not shown conductors. By this, signals from the input/output terminal portions 36A is supplied to the terminal portions 34*a* of the selectively conducting board 34 through the electrode group 35. Signals from the terminal portions 34*a* of the selectively conducting board 34 is transmitted to the input/output terminal portions 36A through the electrode group 35.

On four corners in the board portion 35, support shafts 30 restricting position of the positioning member 32 which will be explained later, and in conjunction therewith, guides movement of the depression body supporting portion 28 are provided. The cylindrical support shafts 30 is constructed with a guide portion 30*a* fixed to the base 36, a portion under engaging 30*c* to be selectively engaged with the slide member 26 and a connecting portion 30*b* connecting the guide portion 30*a* and the portion under engaging 30*c,* as shown in FIG. 1. A diameter of the connecting portion 30*b* becomes smaller than those of the guide portion 30*a* and the portion under engaging 30*c*.

On the substantially center portion on the selectively conducting board 34 which is formed of a resin material into a thin plate form, the terminal positions 34*a* which selectively become conductive by depression are arranged in opposition to the electrode of the semiconductor element 24 and the electrode group 36B of the base 36.

The terminal portions 34*a* of the selectively conducting board 34 are formed of a composite conductive material, such as the composite material consisted of silicone rubber and metal particle, for example. As the composite conductive material, anisotropic conductive rubber is used. Anisotropic conductive rubber has a conductivity in a thickness direction but has no conductivity in a direction along the plane. Also, there are a dispersion type, in which conductive portions are dispersed within a rubber having insulative property and a localized type where a plurality of conductive portions are locally concentrated partially, in the anisotropic conductive rubber. Either type of the anisotropic conductive rubber may be employed. By forming the terminals 34*a* with such anisotropic conductive rubber, a surface contact is established between respective terminals of the semiconductor element 24 and the terminal portions 34*a* to avoid possibility of occurrence of connection failure. In conjunction therewith, damaging due to contacting with the electrodes of the semiconductor element 24 can be successfully avoided.

The conductive portions are formed by conductive particle having electrical conductivity.

The conductive particle is formed of metal particle, such as iron, nickel, cobalt, aluminum, copper and alloy or composition metal particle of two or more thereof, carbon black, iron type whisker (crystal whisker), short fiber type ferromagnetic metal. Carbon black, iron, nickel and copper are preferred in view of economy and electrical conductivity. Particularly preferred conductive particle is a nickel particle having the surface coated by at least one of metals selected among gold, silver, copper, tin, palladium, rhodium, zinc and chrome. It is also possible that the conductive particle is formed by plating the surface of non-magnetic metal particle or inorganic particle, such as glass beads or the like, polymer particle with a material selected among iron, nickel, cobalt or the like.

The conductive particle which is nickel particle with the surface plated by gold, is provided gilding on the nickel particle by electroless plating (chemical plating) or the like. A layer thickness of the nickel particle provided gilding process is preferably greater than or equal to 1000 angstroms, for example. On the other hand, a ratio of plating required for the predetermined number of conductive particle is greater than or equal to 1 Wt %, preferably 2 to 10 Wt %, and more preferably in a range of 3 to 7 Wt %. Also, when silicone rubber is used as the anisotropic conductive rubber, a percentage of covering of a silane type coupling agent in the conductive particle becomes greater than or equal to 5%, and desirably 20 to 100%.

The grain size (D) of the conductive particle is 1 to 1000 ($\mu$m), and desirably 5 to 100 ($\mu$m), for example. Distribution of grain diameter of the conductive particle (grain size $D_w/D_n$) is 1 to 10, and more preferably 1.1 to 4.

By using the conductive particle formed into a spherical shape or star shape and having the grain size within the range set forth above, sufficient electrical contact can be obtained in the conductive portion of the selectively conducting board 34 produced by the conductive particle.

The conductive particle is in a range of 30 to 1000 Wt part relative to 100 wt part a rubber-like polymer, and more preferably in a range of 50 to 750 Wt part. The reason of setting of the ratio of the conductive particle in the range set forth above is that the electrical resistance value upon use as depressed cannot be sufficiently low in the conductive position when the ratio is less than 30 Wt part and thus cannot achieve satisfactory connecting function, and that the conductive portion is hardened to be too brittle to use when the ratio exceeds 1000 Wt part.

As a rubber having insulative property, silicone rubber is desired in view of processability in molding and electrical property.

As a silicone rubber, a crosslinked or condensed liquid silicone rubber is desirable. The liquid silicone rubber is dimethyl silicone crude rubber, methylvinyl silicone crude rubber, methyl phenyl vinyl silicone crude rubber and so forth, for example. A preferred viscosity of the liquid silicone rubber is less than or equal to $10^5$ (P) at a strain velocity of $10^{-1}$ (s). It should be noted that the liquid silicone rubber may be any of condensed type, addition polymerization type, vinyl group type and hydroxyl group containing type. Molecular weight of the rubber like polymer (weight average molecular weight as converted in standard polystyrene) is in a range of 10000 to 40000, a molecular weight distribution index of the rubber-like polymer composition (a ratio of weight average molecular weight as converted in standard polystyrene and number average molecular weight as converted in standard polystyrene) is desirably less than or equal to 2 in view of heat resistance of the obtained selectively conducting board 34.

In addition to the silicone rubber as rubber-like polymer having electrical insulative property, any material which is in liquid state or flowable property upon production of the selectively conducting board 34 and is in liquid state in the normal temperature and solid state rubber as cured by heating, for example. On the other hand, it is also possible to use resin material which is in solid state under normal temperature, fluidized upon production of the selectively conducting board 34 and is in solid state when the completed selectively conducting board 34 is obtained, such as soft liquid epoxy resin, thermoplastic elastomer, thermoplastic soft resin and so forth. Furthermore, when the selectively conducting board 34 as the completed product is obtained, the insulative material having crosslinked structure is desired in view of heat resistance and durability.

As materials of the rubber-like polymer other than silicone rubber, conjugated diene type rubber, such as polybutadiene, natural rubber, polyisoprene, SBR, NBR and hydrogenate material thereof, block copolymer, such as stylenebutadien type rubber, stylenebutadiene block copolymer, styleneisoprene block copolymer and the like and hydrogenate material thereof, choloroprene, fluorine type rubber, urethane rubber, polyester type rubber, epichlorohydrin rubber, ethylene propylene copolymer, ethylene propyrendien copolymer, soft epoxy resin may be used.

In the foregoing rubber-like polymer, inorganic filler, such as silica powder, colloidal silica, aerogel silica, alumina and the like may be contained as required. By containing such inorganic filler, thixotropic properties can be certainly maintained and viscosity becomes high even in the non-cured state of the selectively conducting board 34. Furthermore, dispersion stability of the conductive particle can be improved and strength of the selectively conducting board 34 after curing can be improved.

If relatively large amount of inorganic filler is used, the selectively conducting board 34 becomes brittle. Therefore, the composition of the selectively conductive board 34 is preferably in a range of 100000 to 300000 (cp) at a temperature of 25° C.

On the other hand, upon preparation of the foregoing rubber-like polymer, a catalytic hardener for hardening can be contained. Such catalytic hardener is preferred to be preliminarily admixed to the rubber-like polymer in view point of storage stability and prevention of local concentration of catalyst upon mixing of components. On the other hand, use amount of the catalytic hardener is set at an appropriate amount in consideration of actual hardening speed. At this time, hardening speed may be controlled by additionally using hydrosilylation reaction control agent, such as siloxane containing amino group, siloxane containing hydroxy group and the like.

As the catalytic hardener, organic peroxide, fatty azo compound, hydroxylation catalyst, radiation and the like are desirable, for example.

As organic peroxide, benzoyl peroxide, bisdicyclobenzoyl peroxide, dicumyl peroxide, ditertiary buthyl peroxide and the like is preferred, for example. And, as fatty azo compound, azo bisisobutyronitrile is preferred.

As hydroxylation catalyst, platinum chloride acid and the salt thereof, siloxane complex conrtaining platinum-unsaturated group, a complex of vinyl siloxane and platinum, a complex of platinum and 1,3-divinyl tetramethyl disiloxane, a complex of triorgano phosphine or phosphite and platinum, complex of acetylacetonate platinum chelate, complex of cyclic diene and platinum is desired.

It should be noted that while one selectively conducting board 34 is provided for each base 36 in the foregoing example, the present invention is not limited to the shown embodiment. Under the condition where respective bases 36 are connected mutually, the selectively conducting board 34 may be provided bridging over a plurality of bases 36.

At four corners of the selectively conducting board 34, through holes 34*b,* to which the guide portions 30*a* of the support shafts 30, are provided, as shown in FIG. 4. By restricting position of the selectively conducting board 34 by the support shaft 30, positioning of the terminal portions 34*a* in the selectively conducting board 34 relative to the electrode group 35B of the board portion 35 can be performed appropriately.

The positioning member 32 mounted on the upper surface portion of the selectively conducting board 34 is provided with a substantially square opening portion 32*a* receiving the semiconductor element 24, at the center portion as shown in FIG. 1. The opening portion 32*a* is formed so that the semiconductor element 24 is received therein with defining a gap between the peripheral edge portion of the opening portion 32*a* and the outer periphery of the semiconductor element 24. On the other hand, at the four corner in the positioning member 32, through holes 32*b* engaging with the guide portions 30*a* of the support shafts 30 are provided corresponding to the through holes 34*b* of the selectively conducting board 34.

By this, the electrodes of the semiconductor element 24 can be appropriately positioned relative to the terminal portions 34*a* of the selectively conducting board 34.

As shown in FIG. 1, the depression body supporting portion 28 has an upper surface portion and a lower surface position mutually parallel to each other. At a position of the lower surface portion of the depression body supporting portion 28 corresponding to the opening portion 32*a* of the positioning member 32, a recess 28*d,* in which the depression body 38 is received, is provided. On the other hand, on the upper portion of the depression body support portion 28, a recessed portion 28*a* having a predetermined depth is formed. On the bottom portion of the recessed portion 28*a,* a through aperture 28*e* for inserting a screw BS1 for fixing the depression body 38 within the recess 28*d,* is formed. The depression body 38 has a female thread portion to be engaged with the screw BS1. By this, the depression body 38 is fixed to the depression body support portion 28 by the screw BS1. The depression body 38 is formed of an elastic material, for example, such as rubber material. On the other hand, the depression body 38 is deformed into drum shape as shown by solid line in FIG. 1 when it is contacted with the upper surface of the semiconductor element 24 for pressurizing, and is returned to an initial state shown as shown by two dotted line in FIG. 1 when the depression force is released.

On the four corners in the depression body support portion 28, through holes 28*b,* to which the support shafts 30 are slidably engaged, are provided. On the other hand, between mutually opposing through holes 28*b,* female thread portions 28*c* to be engaged with male thread portions of the screws BS2 are provided in mutual opposition, as shown in FIGS. 1 and 3.

Figure 3:
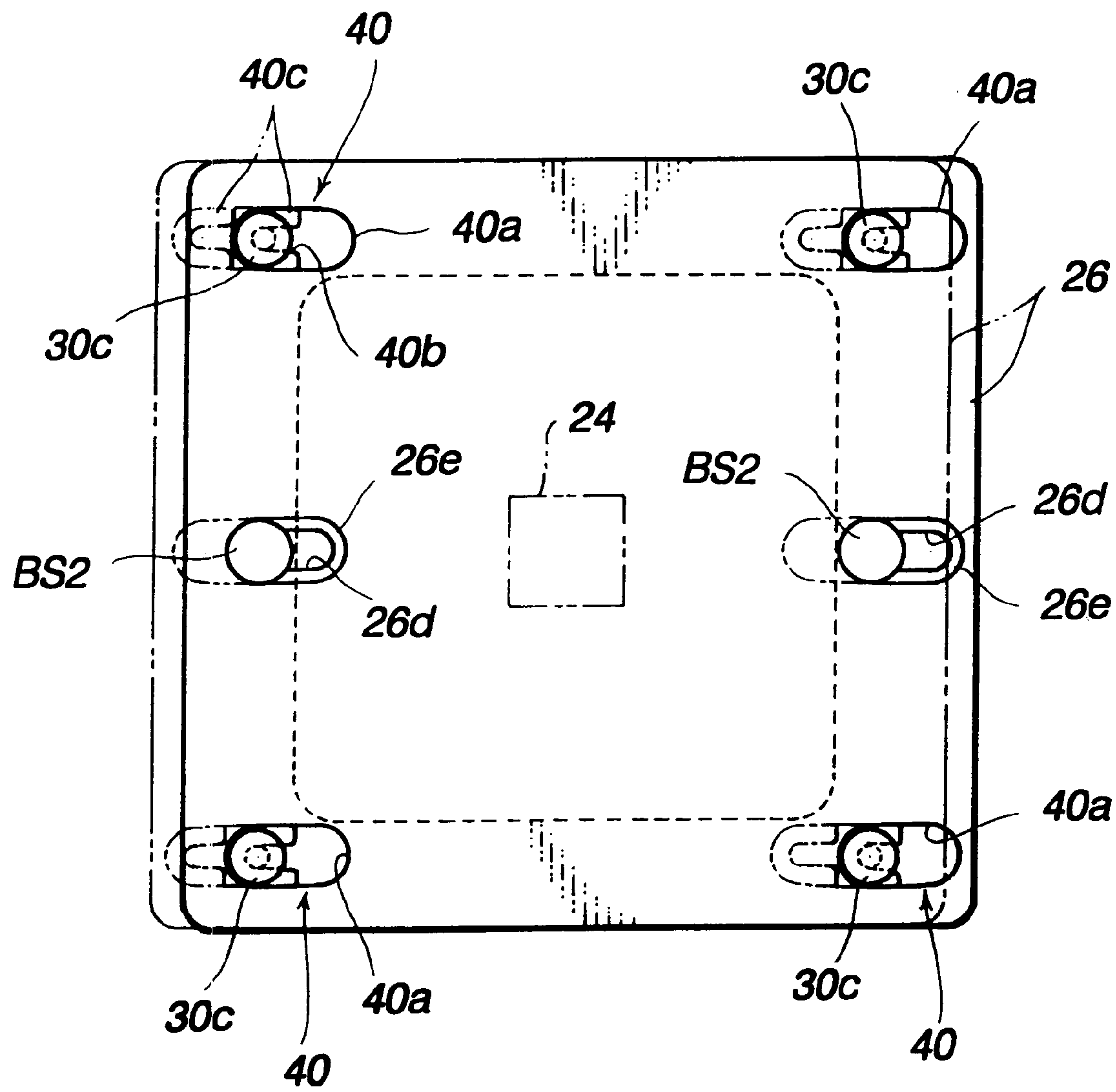
FIG. 3 is a plan view in the embodiment shown in FIG. 1.

On the upper surface portion of the depression body support portion 28, a slide member 26 is provided for sliding within a predetermined distance in the transverse direction in FIGS. 1 and 3. The slide member 26 is formed into a flat plate shape of PPS resin or PES (polyethylene sulfone) resin, PEI (polyethylene imide) resin as head resistant plastic material. In the slide member 26, elongated holes 26*d* extending in the transverse direction in FIG. 3 are respectively provided corresponding to respective female thread portions 28*c* in the depression body support portion 28. On the peripheral edge portion of each elongated hole 26*d,* a step portion 26*e,* on which the head of the screw BS2 is slidably engaged. On the other hand, in the slide member 26, an engaging hole 40 corresponding to the engaging portion 30*c* of each support shaft 30 is provided in substantially parallel to each elongated hole 26*d.*

As shown in FIG. 3, the engaging hole 40 is constructed with an elongated hole 40*a,* in which the engaging portion 30*c* of the support shaft 20 is received, and an engaging piece 40*c* having a cut-out portion 40*b,* in which a connecting portion 30*b* of the support shaft 30 is inserted and holding the engaging portion 30*c* of the support shaft 30.

On one end portion side of the engaging piece 40*c,* a through hole 40*d,* through which the engaging portion 30*c* of the support shaft 30 is inserted, is provided. The engaging piece 40*c* is formed continues with the peripheral edge portion of the through hole 40*d.*

The engaging piece 40*c* restricts motion direction of the slide member 26 in the transverse direction as shown by the solid line in FIG. 3, and in conjunction therewith, fixes the depression body support portion 28 relative to the positioning member 32 and the base 36 by a biasing force of elastic force of the depression body 38. At this time, the semiconductor element 24 is downwardly depressed by the depression body 38.

On the other hand, as shown by two dotted line in FIG. 1, when the slide member 26 is shifted to place the connecting portion 30*b* of the support shaft 30 in the condition disengaged from the cut-out portion 40*b* and to be placed within the through hole 40*d*, the slide member 26 and the depression body support portion 28 is elevated to the position shown by the two dotted line in FIG. 1 by the biasing force on the basis of restoring force of the depression body 38. By this, the slide member 26 and the depression body support portion 28 is moved away relative to the positioning member 32 and the base 36 to be placed in the released state.

In such construction, upon performing inspection of the semiconductor element 24, at first, under the condition where the slide member 26 and the depression body support portion 28 are located away from the positioning member 32 and the base 36, the semiconductor element 24 is loaded on the selectively conducting board 34 as positioned by engaging the outer periphery thereof within the opening portion 32*a* of the positioning member 32 as shown in FIG. 1. At this time, each electrode of the semiconductor element 24 is respectively contacted with each terminal portions 34*a* of the selectively conducting board 34.

Next, under the condition where the depression body 38 of the depression body support portion 28 is arranged above the semiconductor element 24 in opposition to the latter, the depression body support portion 28 is guided by respective support shafts 30. By downward movement of the depression body support member 28 as guided by respective support shaft 30, the tip end of the depression body 38 of the depression body support portion 28 contacts with the upper surface of the semiconductor element 24, and the depression body support portion 28 is arranged in opposition to the positioning member 32, as shown by two dotted line in FIG. 1.

Subsequently, while the slide member 26 is guided by the support shaft 30, the slide member 26 is depressed downwardly to slide the slide member 26 from the position shown by the two doted line in FIG. 1 to the position illustrated by the solid line in FIG. 1, on the upper surface of the depression body support portion 28. By this, each engaging piece 40*c* of the slide member 26 is engaged with the connecting portion 30*b* of each support shaft 30. The slide member 26 is held on the depression body support member 28 by mutual friction force between the engaging portion 30*c* of the support shaft 30 and that depending upon elastic force of the depression body 38. At this time, the electrodes of the semiconductor element 24 are maintained in contact with respective terminal portion 34*a* of the selectively conducting board 34 under a predetermined pressure.

Accordingly, in a sequential process from loading of the semiconductor element 24 in the opening portion 32*a* of the positioning member 32 to pressuring the electrodes of the semiconductor element 24 to respective terminal positions 34*a* of the selectively conducting board 34, the depression body support portion 28 is depressed uniformly along substantially perpendicular direction relative to respective electrodes of the semiconductor element 24 as guided by respective support shafts 30. Also, the slide member 26 is slidably contacted on the upper surface portion of the depression body support portion 28 to slidably engage respective engaging pieces 40*c* of the slide member 26 with the engaging portion 30*c* of the support shaft 30. Therefore, unwanted shearing force may not act between each electrode of the semiconductor element 24 and each terminal portion 34*a* of the selectively conducting board 34. As a result, damaging of each terminal portion 34*a* of the selectively conducting board 34 and the electrode of the semiconductor element 24 can be avoided.

On the other hand, since a uniform pressure acts on the upper surface of the semiconductor element 24, the depression force is uniformly applied to respective terminal portion 34*b* of the selectively conducting board 34 via respective electrodes of the semiconductor element 24. As a result, each electrode of the semiconductor element 24 and respective terminal portion 34*b* of the selectively conducting board 34, and the input/output terminal portion 36A of the board 35 is selectively communicated. On the other hand, by employing the selectively conducting board 34 having the terminal portions formed of anisotropic conductive rubber, inspection can be easily performed even for the semiconductor element having terminals arranged in high density.

Then, under a predetermined environment, a test voltage is supplied via the input/output portion 20A of the printed circuit board 20 and a test is performed. On the other hand, on the basis of the output signal obtained from the input/output portion 20A, a potential defect of the semiconductor element 24 can be judged by not shown diagnostic device.

Figure 5:
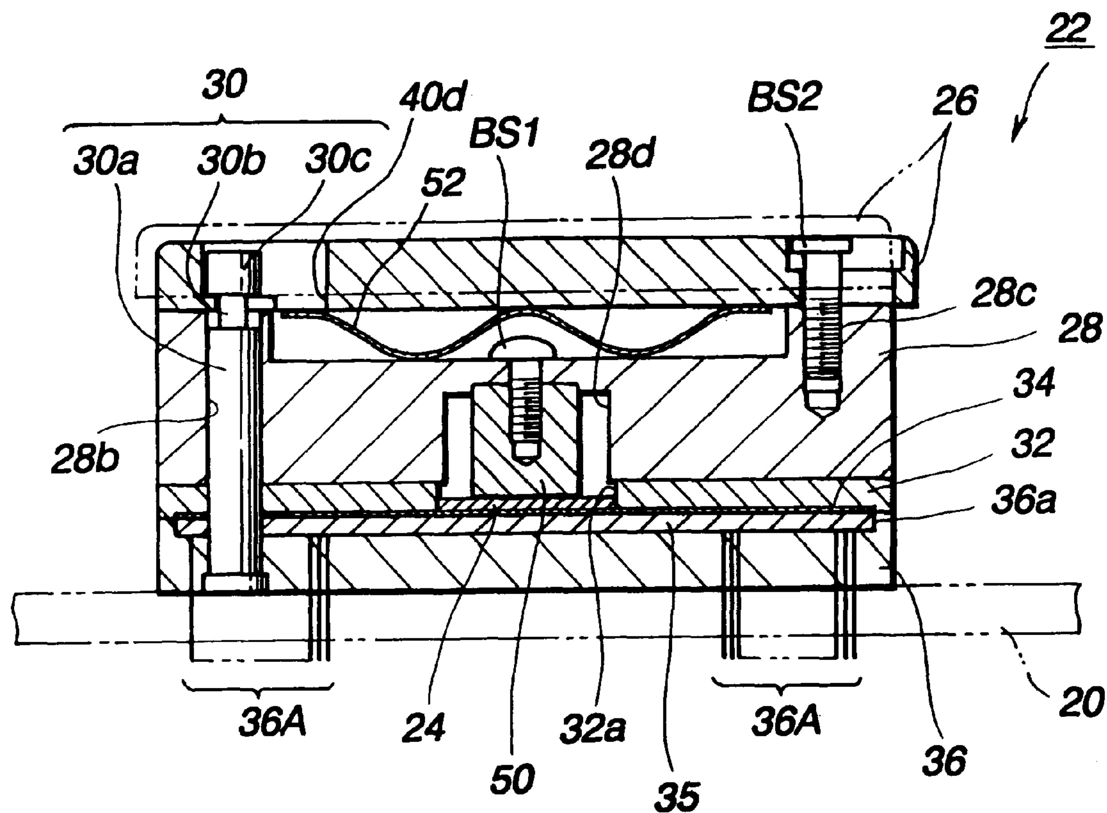
FIG. 5 is a section showing the major part of the second embodiment of the inspection jig according to the present invention.

FIG. 5 shows the second embodiment of the inspection jig according to the present invention.

In the embodiment shown in FIG. 5, in place of the depression body 38 formed of elastic material in the embodiment shown in FIG. 1, a depression body 50 is formed of PPS region, PES (polyethylene sulfone) resin, PEI (polyethylene imide) resin as head resistant plastic material or aluminum alloy material. Also, a leaf spring 52 is provided within a recessed portion 28*a* of the depression body support portion 28 for biasing the depression body 50 downwardly with a predetermined pressure. It should be noted that in FIG. 5 and subsequent embodiments, like elements to those shown in the embodiment of FIG. 1 will be identified by like reference numerals, and redundant disclosure will be avoided in order to keep the disclosure simple enough to facilitate clear understanding of the present invention.

In such construction, upon performing inspection of the semiconductor element 24, at first, under the condition where the slide member 26 and the depression body support portion 28 are located away from the positioning member 32 and the base 36, the semiconductor element 24 is loaded on the selectively conducting board 34 as positioned by engaging the outer periphery thereof within the opening portion 32*a* of the positioning member 32 as shown in FIG. 5. At this time, each electrode of the semiconductor element 24 is respectively contacted with each terminal portions 34*a* of the selectively conducting board 34.

Next, under the condition where the depression body 50 of the depression body support portion 28 is arranged above the semiconductor element 24 in opposition to the latter, the depression body support portion 28 is guided by respective support shafts 30. By downward movement of the depression body support member 28 as guided by respective support shaft 30, the tip end of the depression body 50 of the depression body support portion 28 contacts with the upper surface of the semiconductor element 24, and the depression body support portion 28 is arranged in opposition to the positioning member 32, as shown by two dotted line in FIG. 5.

Subsequently, while the slide member 26 is guided by the support shaft 30, the slide member 26 is depressed downwardly against biasing force of the leaf spring 52 to slide the slide member 26 from the position shown by the two doted line in FIG. 5 to the position illustrated by the solid line in FIG. 5. By this, each engaging piece 40*c* of the slide member 26 is engaged with the connecting portion 30*b* of each support shaft 30. The slide member 26 is held on the depression body support member 28 by mutual friction force between the engaging portion 30*c* of the support shaft 30 and that depending upon resilient force of the leaf spring 52. At this time, the electrodes of the semiconductor element 24 are maintained in contact with respective terminal portion 34*a* of the selectively conducting board 34 under a predetermined pressure depending upon deflection magnitude of the leaf spring 52.

Accordingly, similar effect to the first embodiment as set forth above can be achieved by the second embodiment. Also, in FIG. 5, since the depression body 50 is formed of a material having relatively high durability and the leaf spring 52 is provided for depressing the semiconductor element 24, durability of the inspection jig can be improved.

It should be noted that, in the foregoing first and second embodiments, the slide member 26 is constructed to be placed in selectively engaged condition and disengaged condition relative to the engaging portion 30*c* of the support shaft 30 by reciprocal motion in the transverse direction in FIGS. 1 and 5. However, such construction is not essential. For instance, by providing arc-shaped elongated hole corresponding to the engaging portion 30*c* of the support shaft 30 in the slide member 26, the slide member 26 may be constructed to selectively place in engaged and disengaged condition relative to the engaging portion 30*c* of the support shaft 30 by pivoting the slide member 26 in forward and reverse directions.

On the other hand, it should be noted that a cut-out portion or an opening portion may be provided on the slide member 26 for loading of an object under inspection in the opening portion 32*a* of the positioning member 32 through it.

Figure 6:
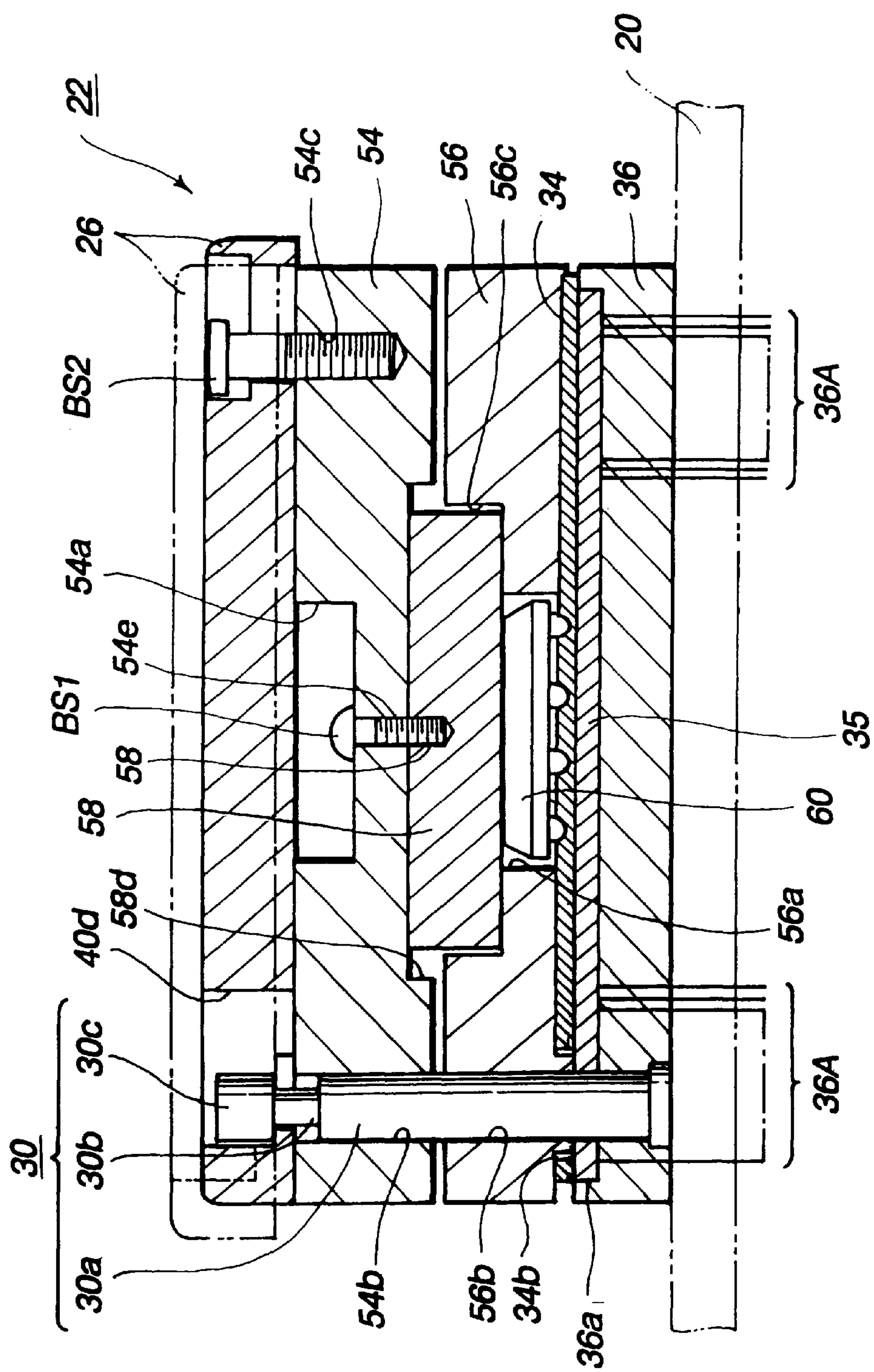
FIG. 6 is a section showing the major part of the third embodiment of the inspection jig according to the present invention.

FIG. 6 shows the third embodiment of the inspection jig according to the present invention.

A semiconductor element 60 as an object under inspection is a surface mount type bear chip, for example. In the semiconductor element 60, surfaces opposing to the selectively conducting board 34 which will be explained later is formed with a plurality of bump shaped electrodes to be connected to the terminal portions of the selectively conducting board 34, over the entire surface.

As shown in FIG. 6, on a positioning member 56 mounted on the upper surface portion of the selectively conducting board 34, a substantially square shaped opening portion 56*a* receiving the semiconductor element 60, is provided at the center portion. The opening portion 56*a* is formed so that the semiconductor element 60 may be engaged with maintaining a predetermined gap between the peripheral edge portion thereof and the outer periphery of the semiconductor element 60. Also, On the other hand, at the four corner in the positioning member 56, through holes 56*b* engaging with the guide portions 30*a* of the support shafts 30 are provided corresponding to the through holes 34*b* of the selectively conducting board 34.

By this, positioning of the positioning member 56 relative to the selectively conducting board 34 is performed, and in conjunction therewith, the electrodes of the semiconductor element 60 can be appropriately positioned relative to the terminal portions 34*a* of the selectively conducting board 34.

Furthermore, on the peripheral edge portion of the opening portion 56*a*, a recessed portion 56*c* having the bottom surface portion contacted by a tip end of the depression body 58, which will be explained later, is formed as a depression force restricting portion.

Figure 7:
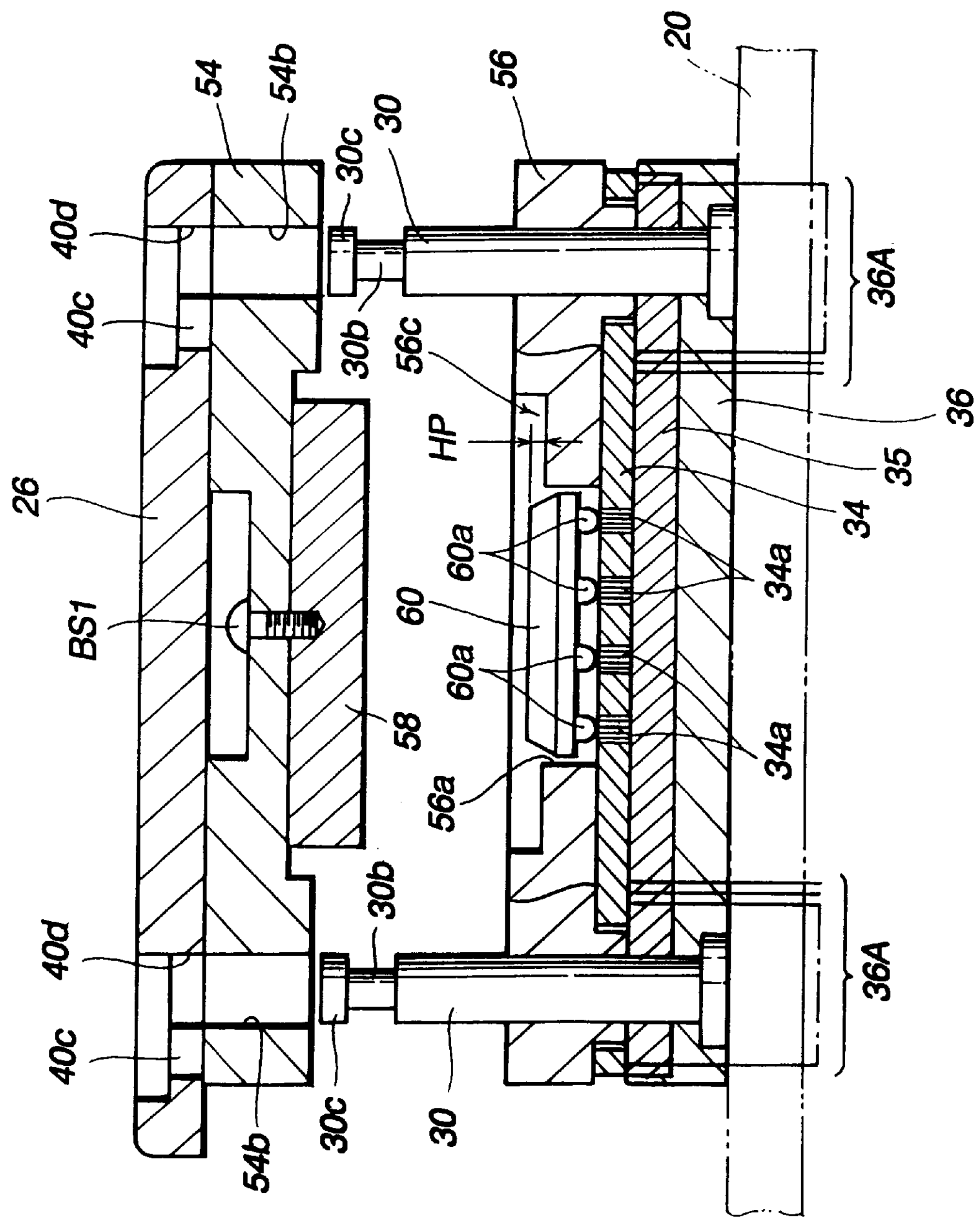
FIG. 7 is a section provided for explanation of operation of the embodiment shown in FIG. 6.

As shown in FIG. 7, the depth of the recessed portion 56 is set so that a step between the position of the upper surface portion of the semiconductor element 60 projecting from the recessed portion 56*c*, upon loading of the semiconductor element 60 in the opening portion 56*a* and the position of the bottom surface portion of the recessed portion 56*c*, namely depression amount Hp, is in a range of 10 to 60%, desirably in a range of 10 to 30% relative to the thickness of the terminal portion 34*a* of the selectively conducting board 34.

The range of the depression amount Hp set in the foregoing range is determined on the basis of characteristics of resistance value R of the anisotropic conductive rubber forming the terminal portions 34*a* of the selectively conducting board 34.

When the anisotropic conductive rubber is compressed with a predetermined pressure, the resistance value R is swiftly lowered to a value Ra until a strain $\epsilon$ reaches 10% according to a predetermined characteristic curve. On the other hand, when the resistance value R becomes a value Rb greater than the value Ra when the strain $\epsilon$ increased from 10% to 60%, for example. Furthermore, the resistance value R tends to increased to be greater than the value Rb when the strain $\epsilon$ is increased beyond 60%.

Accordingly, the depression amount Hp is set within a range of 0 to 60% with respect to the thickness of the terminal portions 34*a* of the selectively conducting board 34 so that the resistance value R of the anisotropic conductive rubber of the terminal portions 34*a* becomes relatively stable value.

On the other hand, by setting the depression amount Hp within such range, durability of the anisotropic conductive rubber is certainly obtained without causing relatively large deformation.

As shown in FIG. 6, the depression body supporting portion 54 has an upper surface portion and a lower surface portion mutually parallel to each other. At a position of the lower surface portion of the depression body supporting portion 54 corresponding to the opening portion 56*a* of the positioning member 56, a recess 58*d*, in which an upper end of the depression body 58 is fixed, is provided. On the other hand, on the upper portion of the depression body support portion 54, a recessed portion 54*a* having a predetermined depth is formed. On the bottom portion of the recessed portion 54*a*, a through aperture 54*e* for inserting a screw BS1 for fixing the upper end of the depression body 58 within the recess 58*d*, is formed. The depression body 58 has a female thread portion 58*a* engaged with the male thread portion of the screw BS1. By this, the upper end of the depression body 58 is fixed to the depression body support portion 54 by the screw BS1. The depression body 58 is formed of an elastic material, such as rubber material.

On the four corners in the depression body support portion 54, through holes 54*b*, to which the support shafts 30 are slidably engaged, are provided. On the other hand, between mutually opposing through holes 54*b*, female thread portions 54*c* to be engaged with male thread portions of the screws BS2 are provided in mutual opposition.

On the upper surface portion of the depression body support portion 54, a slide member 26 is provided for sliding within a predetermined distance in the transverse direction in FIG. 6.

In such construction, upon performing inspection of the semiconductor element 60, at first, under the condition where the slide member 26 and the depression body support portion 54 are located away from the positioning member 56 and the base 36 as shown in FIG. 7, the semiconductor element 60 is loaded on the selectively conducting board 34 as positioned by engaging the outer periphery thereof within the opening portion 56*a* of the positioning member 56. At this time, each electrode 60*a* of the semiconductor element 60 is respectively contacted with each terminal portions 34*a* of the selectively conducting board 34.

Next, under the condition where the depression body 58 of the depression body support portion 54 is arranged above the semiconductor element 60 in opposition to the latter, the depression body support portion 54 is guided by respective support shafts 30. By downward movement of the depression body support member 54 as guided by respective support shaft 30, the tip end of the depression body 58 of the depression body support portion 54 contacts with the upper surface of the semiconductor element 60, and the depression body support portion 54 is arranged in opposition to the positioning member 56.

Subsequently, while the slide member 26 is guided by the support shaft 30, the slide member 26 is depressed further downwardly to slide the slide member 26 from the position shown by the two doted line in FIG. 6 to the position illustrated by the solid line in FIG. 6, on the upper surface of the depression body support portion 54.

Figure 8:
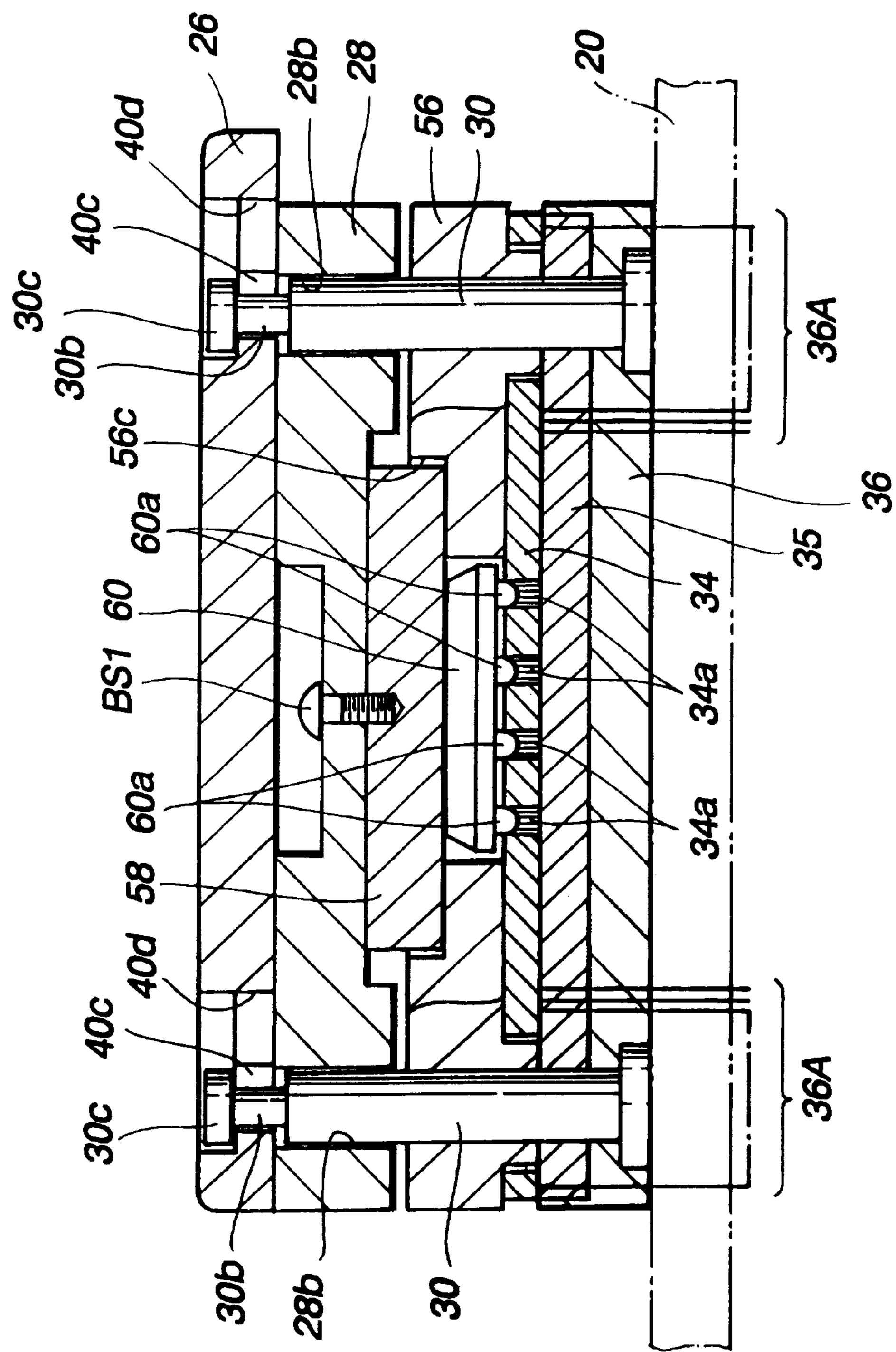
FIG. 8 is a section provided for explanation of operation of the embodiment shown in FIG. 6.

By this, each engaging piece 40*c* of the slide member 26 is engaged with the connecting portion 30*b* of each support shaft 30 as shown in FIG. 8.

The slide member 26 is held on the depression body support portion 54 by mutual friction force between the engaging portion 30*c* of the support shaft 30 and that depending upon resilient force of the depression body 58.

At this time, the lower end surface of the depression body 58 is contacted on the bottom surface portion of the recessed portion 56*c*. Thus, the electrode 60*a* of the semiconductor element 60 is not depressed in a magnitude beyond the predetermined depression amount Hp. As a result, the electrode 60*a* of the semiconductor element 60 is maintained in the depressed condition with respect to respective terminal positions 34*a* of the selectively conducting board 34 with a predetermined appropriate allowable pressure.

In a sequential process from loading of the semiconductor element 60 in the opening portion 56*a* of the positioning member 56 to pressuring the electrodes of the semiconductor element 60 to respective terminal positions 34*a* of the selectively conducting board 34, the depression body support portion 54 is depressed uniformly along substantially perpendicular direction relative to respective electrodes of the semiconductor element 60 as guided by respective support shafts 30. Also, the slide member 26 is slidably contacted on the upper surface portion of the depression body support portion 54 to slidably engage respective engaging pieces 40*c* of the slide member 26 with the engaging portion 30*c* of the respective support shaft 30. Therefore, unwanted shearing force may not act between each electrode of the semiconductor element 60 and each terminal portion 34*a* of the selectively conducting board 34. As a result, damaging of each terminal portion 34*a* of the selectively conducting board 34 and the electrode 60*a* of the semiconductor element 60 can be avoided.

On the other hand, since a uniform pressure acts on the upper surface of the semiconductor element 60, the depression force is uniformly applied to respective terminal portion 34*b* of the selectively conducting board 34 via respective electrodes 60*a* of the semiconductor element 60. As a result, each electrode 60*a* of the semiconductor element 60 and respective terminal portion 34*b* of the selectively conducting board 34, and the input/output terminal portion 36A of the board 35 is selectively communicated. On the other hand, by employing the selectively conducting board 34 having the terminal portions formed of anisotropic conductive rubber, inspection can be easily performed even for the semiconductor element having terminals arranged in high density.

Figure 9:
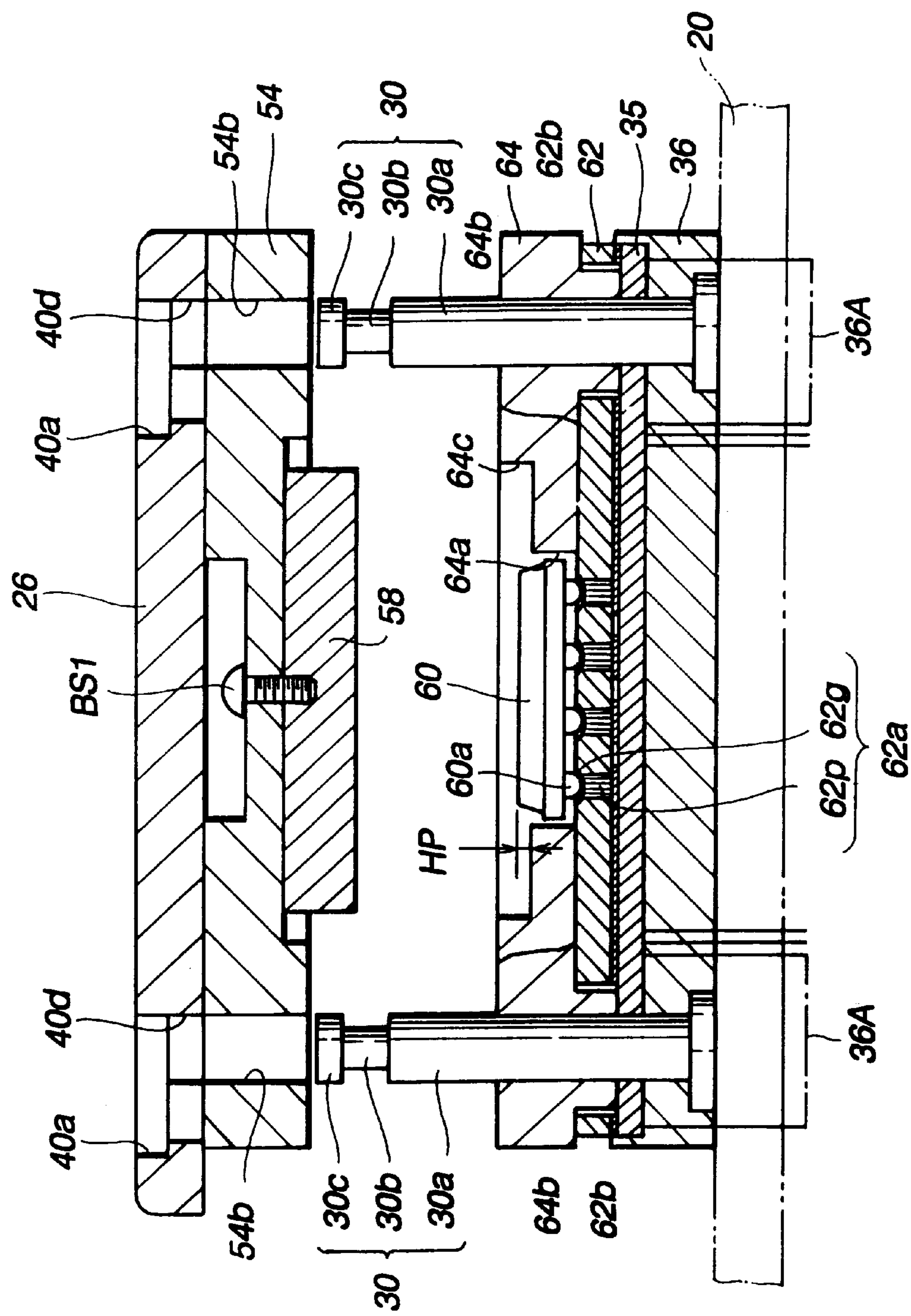
FIG. 9 is a section showing the major part of the fourth embodiment of the inspection jig according to the present invention.
Figure 10:
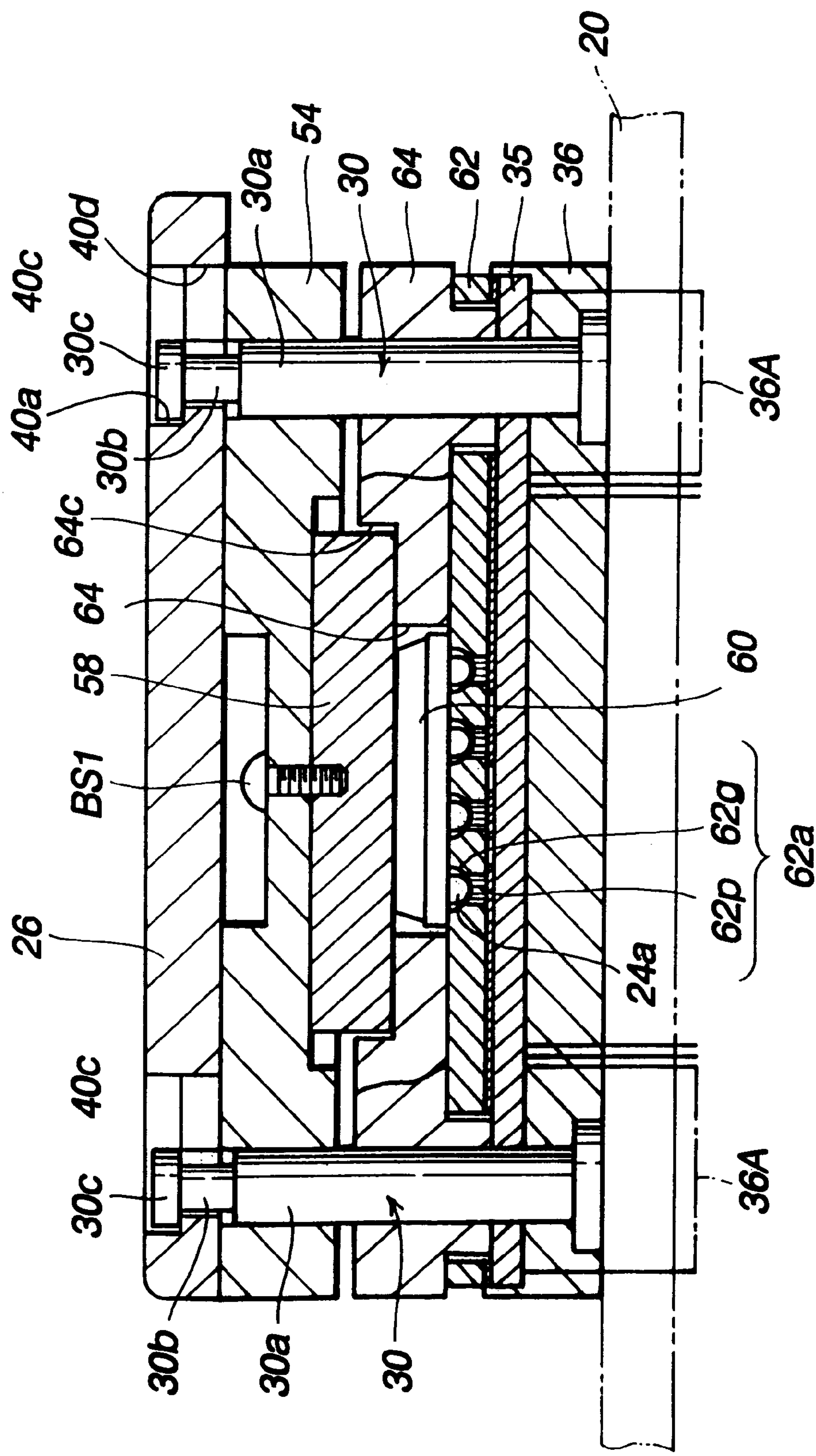
FIG. 10 is a section provided for explanation of operation of the embodiment shown in FIG. 9.

FIGS. 9 and 10 show the fourth embodiment of the inspection jig according to the present invention.

It should be noted that, in FIGS. 9 and 10, like elements to those shown in the embodiment of FIGS. 6 to 8 will be identified by like reference numerals, and redundant disclosure will be avoided in order to keep the disclosure simple enough to facilitate clear understanding of the present invention.

In an intermediate member 64 mounted on the upper surface portion of a selectively conducting substrate 62, a receptacle portion 64*a* in substantially square shaped configuration for receiving the semiconductor element 60 is provided at the center portion thereof, as shown in FIG. 9. The recentacle portion 64*a* is formed in such a manner that the semiconductor element 60 is arranged therein with defining a predetermined gap between the peripheral edge portion thereof and the outer periphery of the semiconductor element 60.

On the other hand, at the four corner in the intermediate member 64, through holes 64*b* engaging with the guide portions 30*a* of the support shafts 30 are provided corresponding to the through holes 62*b* of the selectively conducting board 62. By this, positioning of the intermediate member 64 relative to the selectively conducting board 62 is performed.

Furthermore, on the peripheral edge portion of the receptacle portion 64*a*, a recessed portion 64*c* having the bottom surface portion contacted by the tip end of the depression body 58 is formed as a depression force restricting portion.

As shown in FIG. 9, the depth of the recessed portion 64*c* is set so that a step between the position of the upper surface portion of the semiconductor element 60 projecting from the recessed portion 64*c* and the position of the bottom surface portion of the recessed portion 64*c*, upon loading of the semiconductor element 60 in the opening portion 64*a*, namely depression amount Hp, is in a range of 10 to 60%, desirably in a range of 10 to 30% relative to the thickness of the terminal portion 62*a* of the selectively conducting board 62. The reason of setting the depression amount Hp within the range set forth above is the same reason as explained in connection with the embodiment shown in FIG. 6.

In the substantially center portion in the selectively conducting board 62 formed into thin plate form of the resin material, the terminal portions 62*a* selectively placing in conductive state by depression, are arranged corresponding to the electrodes of the semiconductor element 24 and the electrode group 35B of the board portion 35, as shown in FIG. 9. On the four corner in the selectively conducting board 62, through holes 62*b*, through which the projecting portion of the intermediate member 64 extending through the guide portion 30*a* of the support shaft 30, are provided respectively, as shown in FIG. 9.

By this, restriction of the position of the selectively conducting board 62 by the support shaft 30, positioning relative to the electrode group 35B of the board portion 35 of the terminal portion 62*a* in the selectively conducting board 62 can be performed appropriately.

Figure 11:
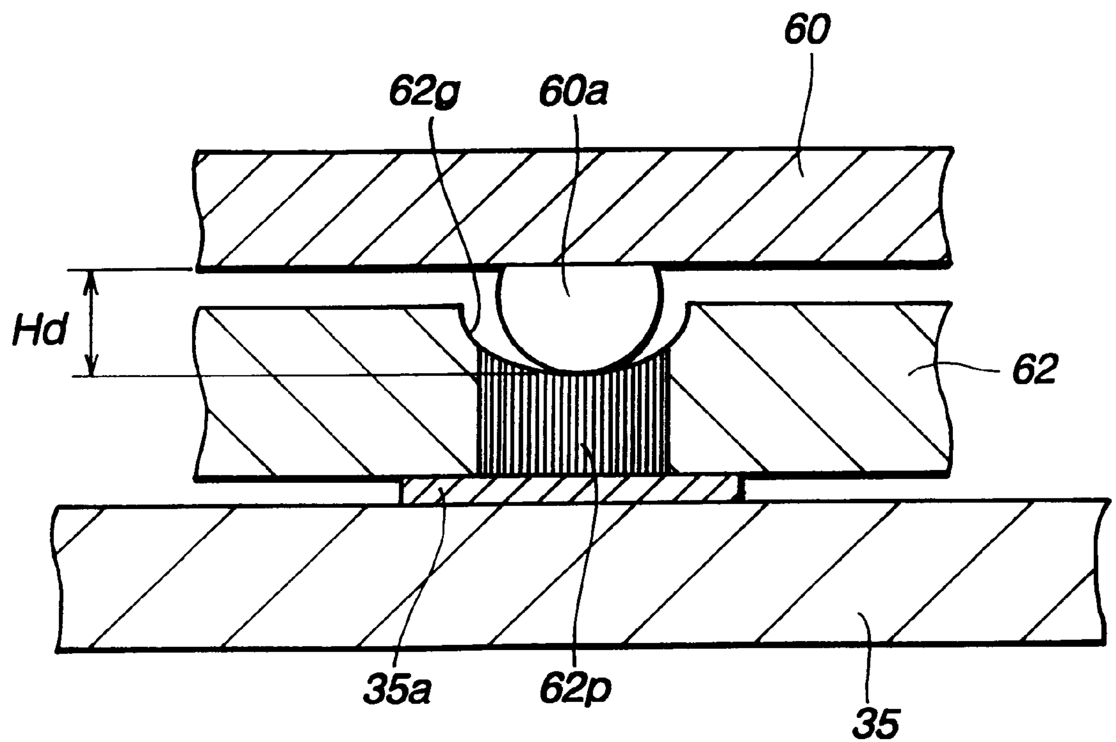
FIG. 11 is a section provided for explanation of operation of the embodiment shown in FIG. 9.
Figure 12:
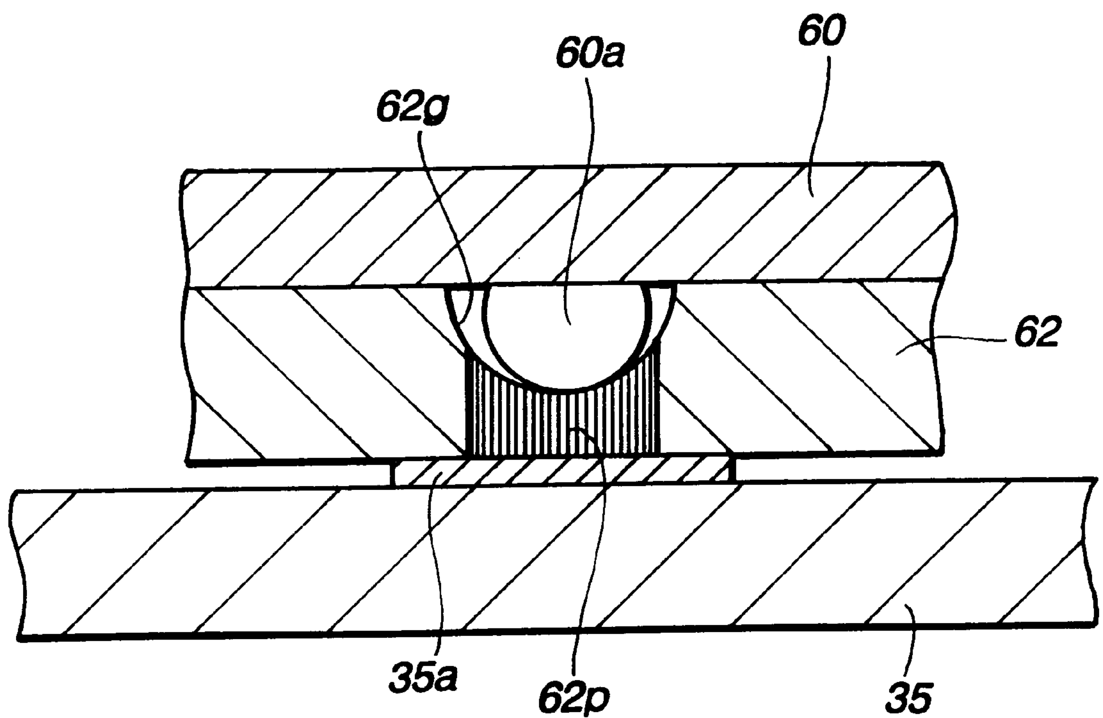
FIG. 12 is a section provided for explanation of operation of the embodiment shown in FIG. 9.

On the other hand, to the end portion opposing the electrode 60*a* of the semiconductor element 60 in respective conductive portion 62*p* of the terminal position 62*a* including a plurality of the conductive portions 62*p*, a substantially spherical recessed portion 62*g* as portion under engaging are individually provided per respective electrodes 60*a*, as shown in FIGS. 11 and 12 in enlarged fashion. A curve radius of the recessed portion 62*g* is set to be greater than the curve radius of the electrode 60*a*, for example. On the other hand, the effective depth of the engaging portion of the recessed portion 62*g*, in which the electrode 60*a* is received, is set to 5 to 150% of the height Hd of the electrode 60*a*, and more preferably in a range of 40 to 80% of height of the electrode 60*a*. It should be noted that when the effective depth of the recessed portion 62*g* is set in a range of 100 to 150% of the height Hd of the electrode 60*a*, the depression force is distributed to the peripheral portion of the conductive portion 62*p* to successfully avoid damaging of the conductive portion 62*p* due to stress concentration.

When the semiconductor element 60 mounted on the selectively conducting board 62 is not depressed by the depression body 58 as shown in FIG. 9, the tip end of the electrode 60*a* of the semiconductor element 60 and the bottom surface portion of the recessed portion 62*g* are contacted as shown in FIG. 11. At this time, a gap is formed between the upper surface portion of the selectively conducting board 62 and the lower surface opposing the upper surface of the selectively conducting board 62 in the semiconductor element 60.

On the other hand, when the semiconductor element 60 mounted on the selectively conducting board 62 is depressed by the depression body 58 as shown in FIG. 10, the tip end of the electrode 60*a* of the semiconductor element 60 and the bottom surface portion of the recessed portion 62*g* are contacted and the conductive portion 62*p* is compressed. By this, as shown in FIG. 12, the conductive portion 62*p* is communicated with the contact 35*a* of the board portion 35. In conjunction therewith, since the contact area between the tip end of the electrode 60*a* of the semiconductor element 60 and the bottom surface portion of the recessed portion 62*g* is increased to reduce the surface pressure per unit area, a strain is restricted.

In such construction, upon performing inspection of the semiconductor element 60, at first, under the condition where the slide member 26 and the depression body support portion 54 are located away from the intermediate member 64 and the base 36 as shown in FIG. 9, the semiconductor element 60 is loaded on the selectively conducting board 62 arranged in the receptacle portion 64*a* of the intermediate member 64. At this time, each electrode 60*a* of the semiconductor element 60 is respectively engaged with the recessed portion 62*g* of respective conductive portion 62*p* corresponding to respective terminal portions 62*a* of the selectively conducting board 62. By this, positioning of the semiconductor element 60 relative to the terminal portion 62*a* of the selectively conducting board 62 can be performed accurately, and respective conductive portions 62*p* and respective electrodes 60*a* are certainly contacted. Accordingly, positioning of the semiconductor element 60 relative to the terminal portions 62*a* of the selectively conducting board 62 is facilitate irrespective of tolerance of the outer shell portion of the semiconductor element 60 in molding.

Next, under the condition where the depression body 58 of the depression body support portion 54 is arranged above the semiconductor element 60 in opposition to the latter, the depression body support portion 54 is guided by respective support shafts 30. By downward movement of the depression body support member 54 as guided by respective support shaft 30, the tip end of the depression body 58 of the depression body support portion 54 contacts with the upper surface of the semiconductor element 60, and the depression body support portion 54 is arranged in opposition to the intermediate member 64.

Subsequently, while the slide member 26 is guided by the support shaft 30, the slide member 26 is depressed further downwardly to slide the slide member 26 to the position illustrated by the solid line in FIG. 10, on the upper surface portion of the depression body support portion 54.

Thus, as shown in FIG. 10, each engaging piece portion 40*c* of the slide member 26 is engaged with the connecting portion 30*b* of each support shaft 30. The slide member 26 is held on the depression body support portion 54 by mutual frictional force of the engaging portion 30*c* of the support shaft 30 depending upon the elastic force of the depression body 58.

At this time, the lower end surface of the depression body 58 is contacted on the bottom surface portion of the recessed portion 64*c*. Thus, the electrode 60*a* of the semiconductor element 60 is not depressed in a magnitude beyond the predetermined depression amount Hp. As a result, the electrode 60*a* of the semiconductor element 60 is maintained in the depressed condition with respect to respective terminal positions 62*p* of the selectively conducting board 62 with a predetermined appropriate allowable pressure.

In a sequential process from loading of the electrodes 60*a* of the semiconductor element 60 in the receptacle portion 64*a* of the intermediate member 64 to pressuring the electrodes 60*a* of the semiconductor element 60 to respective conductive portions 62*p* of the selectively conducting board 62, the depression body support portion 54 is depressed uniformly along substantially perpendicular direction relative to respective electrodes 60*a* of the semiconductor element 60 as guided by respective support shafts 30. Also, the slide member 26 is slidably contacted on the upper surface portion of the depression body support portion 54 to slidably engage respective engaging pieces 40*c* of the slide member 26 with the engaging portion 30*c* of the support shaft 30. Therefore, unwanted shearing force may not act between each electrode 60*a* of the semiconductor element 60 and each terminal portion 62*a* of the selectively conducting board 62. As a result, damaging of each terminal portion 62*a* of the selectively conducting board 62 and the electrode 60*a* of the semiconductor element 60 can be avoided. On the other hand, by employing the selectively conducting board 62 having the terminal portions 62*a* formed of anisotropic conductive rubber, inspection can be easily performed even for the semiconductor element having terminals arranged in high density. On the other hand, since an uniform pressure acts on the upper surface of the semiconductor element 60, the depression force is uniformly applied to respective terminal portion 62*a* of the selectively conducting board 62 via respective electrodes 60*a* of the semiconductor element 60. As a result, each electrode 60*a* of the semiconductor element 60 and respective terminal portion 62*a* of the selectively conducting board 62 is communicated to the input/output terminal portion 36A of the board 35.

Figure 13:
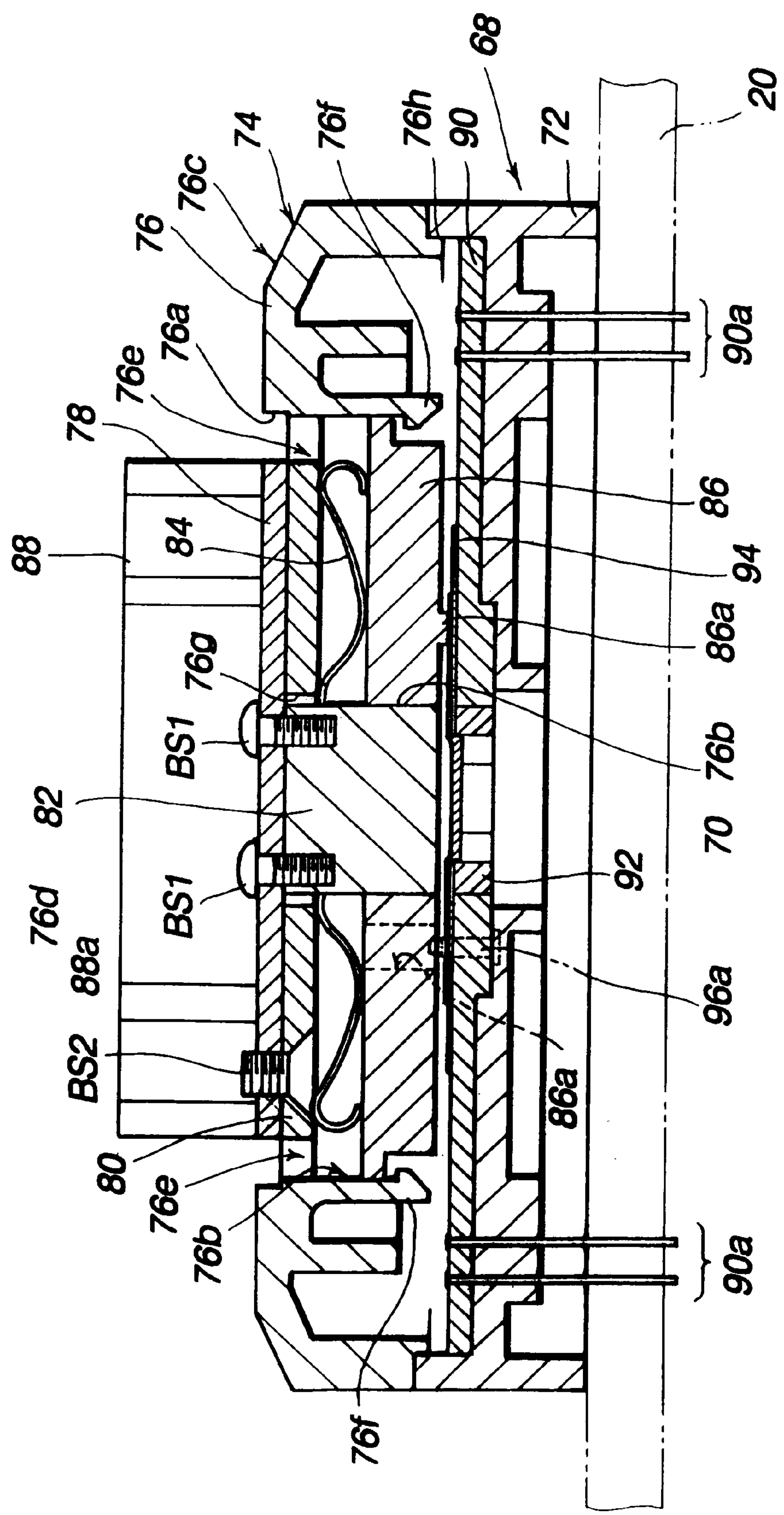
FIG. 13 is a section showing the major part of the fifth embodiment of the inspection jig according to the present invention.

FIG. 13 shows a construction of the major part of the fifth embodiment of the inspection jig according to the present invention. In the embodiment shown in FIG. 13, the inspection jig is construction with including the object under inspection receptacle member 68 having receptacle chambers which receive respective of semiconductor elements 70 as the objects under inspection arranged at predetermined positions in every direction on the printed circuit board 20.

Figure 14:
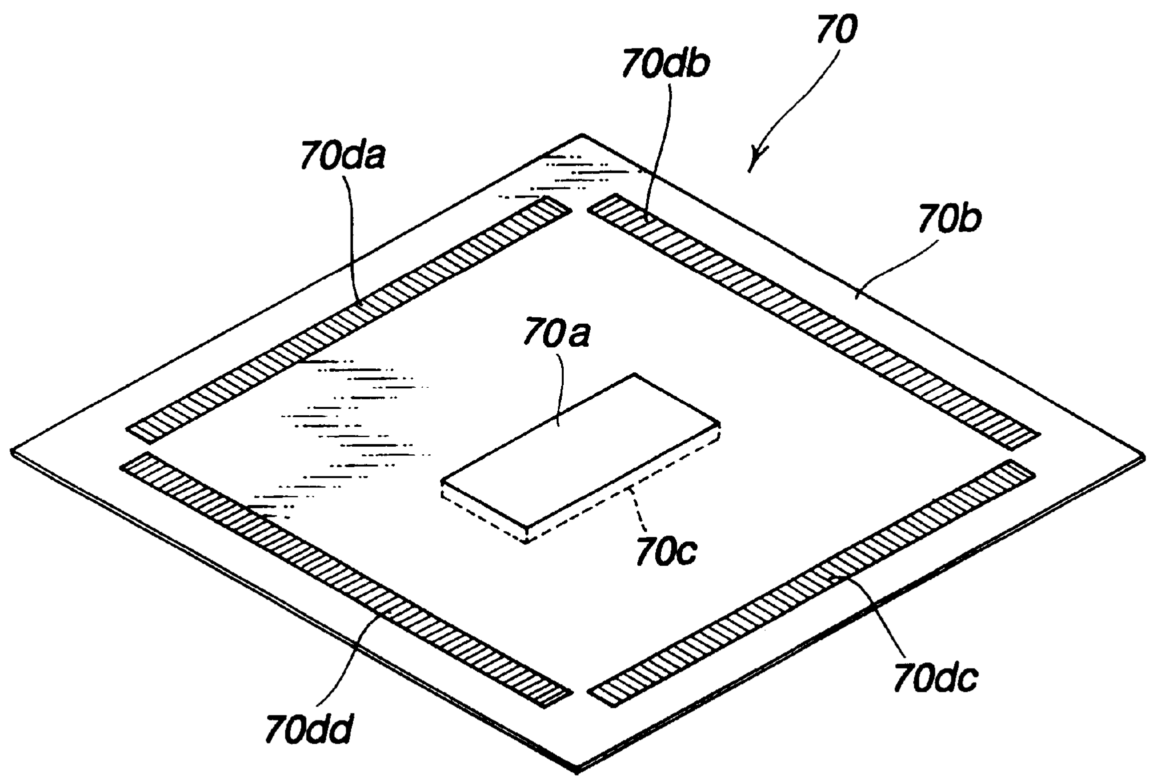
FIG. 14 is a perspective view showing an external view of a semiconductor element, to which the fifth embodiment shown in FIG. 13 is applied.

The semiconductor element 70 as the object under inspection is a substantially square shaped flat package type semiconductor element as shown in FIG. 14, and includes a chip portion 70*a,* in which is received a semiconductor integrated circuit and a package portion 70*b* surrounding the peripheral position of the chip portion 70*a* electrically connected to the latter. The chip portion 70*a* of substantially rectangular flat plate form is arranged at substantially center portion in the package portion 70*b* and is downwardly extended from one surface of the package portion 70*b* in a predetermined thickness. In the chip portion 70*a,* a projection 70*c* projecting from one surface of the package portion 70*b* has mutually intersecting shorter edges and longer edge. On the shorter edge and the longer edge, end faces finished with relatively high accuracy are formed.

On the peripheral edge portion of the relatively thin flat plate form package portion 70*b,* terminal portions 70*da* and 70*dc* connected with the chip portion 70*a* and to be used for connection with external terminal, are provided in opposition to respective longer edges of the chip portion 70*a,* and terminal portions 70*db* and 70*dd* similar to the terminal portions 70*da* and 70*dc* are provided in opposition to respective shorter edges of the chip portion 70*a.*

As shown in FIG. 13, the object under inspection receptacle member 68 includes a base 72, to which the semiconductor 70 is loaded and a cover member 74 arranged on the upper surface portion of the base 72 and covering the upper surface portion of the base 72.

As shown in FIG. 13, the cover member 74 includes a cover main body portion 76 forming an outer shell, a guide member 82 fixed to a recessed portion 76*a* provided on the upper surface portion of the cover main body portion 76, a depression body 86 arranged within an internal space 76*b* formed below the recessed portion 76*a* of the cover main body portion 76 and a leaf spring 84 arranged between the upper surface of the depression body 86 and a wall surface defining the upper portion of the internal space 76*b* and biasing the depression body 86 in the downward direction, namely in the direction toward the semiconductor element 70.

On the upper surface of the cover main body portion 76, a tiled surface portion 76*c* having a predetermined tilt angle over the entire periphery. On the entire peripheral edge portion in the lower surface of the cover main body portion 76, a stepped portion 76*h* engaged with the peripheral edge portion of the base 72 which will be explained. On the other hand, on edge in mutually opposing longitudinal direction, respective of recessed portions 76*d,* to which the engaging surface portions 88*a* of the hook member 88 which will be explained later are engaged, are provided.

On the bottom portion of the recessed portion 76*a* provided on the upper portion of the cover main body portion 76, an opening portion 76*e* communicating the external space and internal spaces 76*b* are provided at four positions in opposition to each other. On the peripheral edge of each opening portion 76*e,* an engaging piece 76*f* holding the depression body 86 is provided. The engaging piece 76 is continuous with the peripheral edge of the corresponding opening portion 76*e* and extended downwardly.

On the bottom portion at the center portion of the recessed portion 76*a,* a plate member 78 is fixed by a screw BS2. On the lower surface portion of the plate member 78, a guide member 82 to be inserted into the opening portion 76*g* is fixed by means of the screw BS1.

The depression body 86 has a contact portion 86*a* contacting with respective terminal portions 70*da* to 70*dd* in the package portion 70*b* of the semiconductor element 70 loaded at the position opposing to the lower surface portion of the depression body 86. At the portion inclined toward the center portion from the contact portion 86*a* in the depression body 86, a through hole 86*b,* in which the guide member 82 is inserted, is provided. Also, on the circumference of the through hole 86*b,* through holes 86*c,* to which tip ends of respective of positioning pins 96*a,* 96*b,* 96*c* and 96*d* are inserted, are provided respectively.

With such constriction, the depression body 86 is held at the outer peripheral portion by means of the engaging piece 76*f* and depressed downwardly by the biasing force of the leaf spring 84 in the condition guided by the guide member 82 which is inserted into the through hole 86*b.*

The base 72 mounted at the predetermined position in the printed circuit board 20 has a printed board 90 having terminal portions 90*a* connected to contacts of the printed circuit board 20, on the inside of the peripheral wall portion thereof.

Accordingly, the object under inspection receptacle chamber defines a space surrounded by the surface of the printed board 90, the inner peripheral wall surface of the base 72 and the inner surface portion of the cover member 74 set forth above.

On the outside of the peripheral wall portion along the longitudinal direction of the base 72, hook members 88 having an engaged surface portions 88*a* to be engaged with the recessed portion 76*d* of the cover main body portion 76 are provided in opposition to the base 72, respectively. The hook portions 88 are pivotably supported on the support shaft provided on the base 72. By engaging the engaging surface portions 88*a* of a pair of hook member 88 to the recessed portion 76*d* of the cover member 74, the cover member 74 is held to the base 72.

On substantially center portion in the printed board 90, a positioning member 92 having a recessed portion 48*a,* to which the projecting portion 70*c* as engaging portion of the chip portion 70*a* in the mounted semiconductor element 70 are engaged, is provided. The positioning member 92 is formed of a heat resistive material, such as ceramic. The recessed portion 92*a* of the positioning member 92 is formed into substantially rectangular configuration corresponding to the shape of the projecting portion 70*c* of the chip portion 70*a* in the mounted semiconductor element 70. Also, the lengths of respective of the longer edge and the shorter edge are set lengths greater than respectively corresponding lengths of the projecting portion 70*c* of the chip portion 70*a* so that a quite small gap is defined between the peripheral edge portion of the recessed portion 92 and the outer peripheral surface portion of the projecting portion 70*c* of the chip portion 70*a.* On the peripheral edge portion of the recessed portion 92, arc-shaped portion 92*b* are formed at four corners. On the other hand, the gap is set corresponding to relative positioning precision of the terminal portions 70*da* to 70*dd* of the semiconductor element 70 relative to the terminal portions of the selectively conducting board 50 which will be explained later. Namely, an allowable tolerance of the gap is set in a range satisfying required relative positioning precision.

By this, the relative positioning precision of the terminal portions 70*da* to 70*dd* of the semiconductor element 70 relative to the selectively conducting board 50 which will be explained later, can be maintained depending upon the precision of the gap.

It should be noted that the positioning member 92 is formed separately from the printing board 90 as shown in the foregoing embodiment. However, it may be integrally formed with the printed board 90, for example.

In the portion of the printed board 90, to which the selectively conducting board 50 which will be explained later, is mounted four terminal portions provided surrounding respective positioning members 92 at the positions corresponding to the terminal portion of the selectively conducting board 50 and the terminal portions 70*da* to 70*dd* of the semiconductor member 70 are mounted.

One of pairs of the terminal portions in the printed board 90 oppose to each other with a predetermined distance across the longer edge of the positioning member 92, and the other pair of the terminals are oppose each other with a predetermined distance across the shorter edge of the positioning member 92.

On the position of the printed board 90 opposing to the longer edge of the positioning member 92 across the terminal portion, the positioning pins 96*a* and 96*b* performing positioning of the terminal portions of the selectively conducting board 50 relative to the terminal portions of the printed board 90 are provided in opposition to each other. On the other hand, similar positioning pin 96*d* is provided in opposition to the pin 96*a* across the terminal portion in the printed board 90. Furthermore, the similar positioning pin 96*c* is provided in opposition of the longer edge of the positioning member 92 across the terminal portion thereof and in mutual opposition to the pin 96*d*.

On the outer surrounding of four terminal portions in the printed board 90, the terminal portions are respectively connected at one end by the conductors which are not illustrated, and input/output terminals 90*a* as input/output portions connected to respective contacts of the printed circuit board 20 are provided on the other end.

Figure 15:
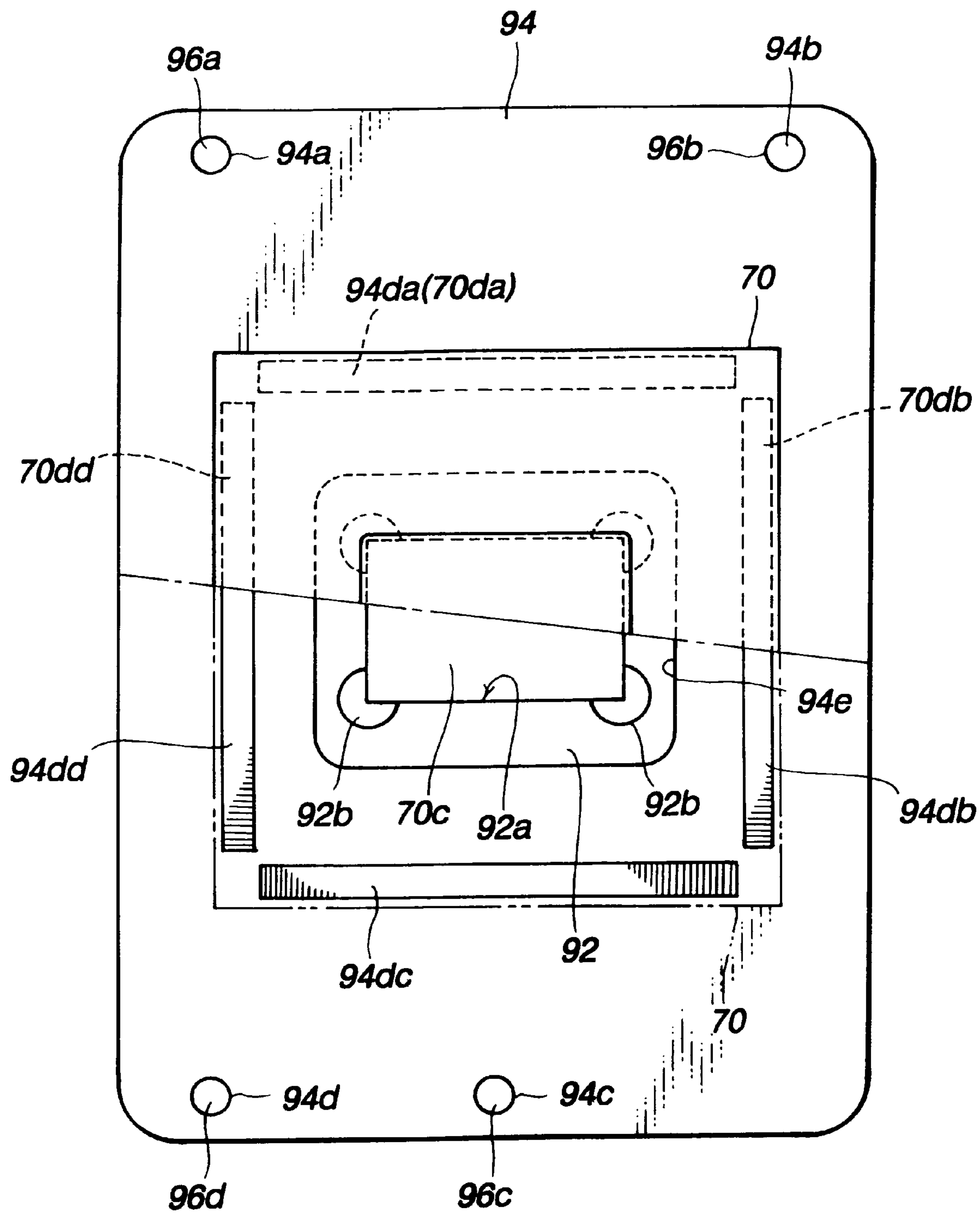
FIG. 15 is a plan view showing the major part of the embodiment shown in FIG. 13.

On the selectively conducting board 50 mounted on the printed board 90, terminal portions 94*da,* 94*db,* 94*dc* and 94*dd* formed of a composite conductive material, such as a composite material consisted of silicone rubber and metal particle, corresponding to respective terminal portions of the mounted semiconductor element 70, are provided on the printed board 90, as shown in FIG. 15. As the composite material, anisotropic conductive rubber is employed. Anisotropic conductive rubber is a material having conductivity in the thickness direction and no conductivity in a direction along the plane. As anisotropic conductive rubber, any of a dispersion type, in which the conductive portions are dispersed within a rubber having insulative property, and a localized type, in which the conductive portions are locally concentrated, may be employed. By forming the terminal portions 94*da* to 94*dd* by such anisotropic conductive rubber, respective terminal portions of the semiconductor element 70 and the terminal portions 94*da* to 94*dd* are connected by surface contact to avoid contact failure. In conjunction therewith, damaging by contacting with the terminal portions 94*da* to 94*dd* can be avoided.

As shown in FIG. 15, at the position opposing the positioning member 92 in the selectively conducting board 94, an opening portion 94*e,* through which the projecting portions 70*c* of the semiconductor element 70 extends, are provided. On the other hand, at the positions corresponding to the pins 96*a* to 96*d* on the printed board 90 in the selectively conducting board 94, through holes 94*a,* 94*b,* 94*c* and 94*d,* through which respective of corresponding pins are inserted, are provided. By this, positioning of respective terminal portions 94*da* to 94*dd* of the selectively conducting board 94 relative to the terminal positions 90*da* to 90*dd* of the printed board 90, is performed.

In the construction set forth above, upon performing inspection for the semiconductor element 70, at first, the semiconductor element 70 is mounted on the selectively conducting board 94 as positioned by engaging the projecting portion 70*c* as the engaging portion thereof to the recessed portion 92*a* of the printed board 90. At this time, respective terminal portions 70*da* to 70*dd* of the semiconductor element 70 are respectively contacted with respective terminal portions 94*da* to 94*dd* of the selectively conducting board 94.

Accordingly, positioning of respective terminal portions 70*da* to 70*dd* of the semiconductor element 70 to respective terminal portions 94*da* to 94*dd* of the selectively conducting board 94 is easily, certainly and accurately performed since relatively high precision of engagement between the projecting portion 70*c* and the recessed portion 92*a* is maintained.

Figure 16:
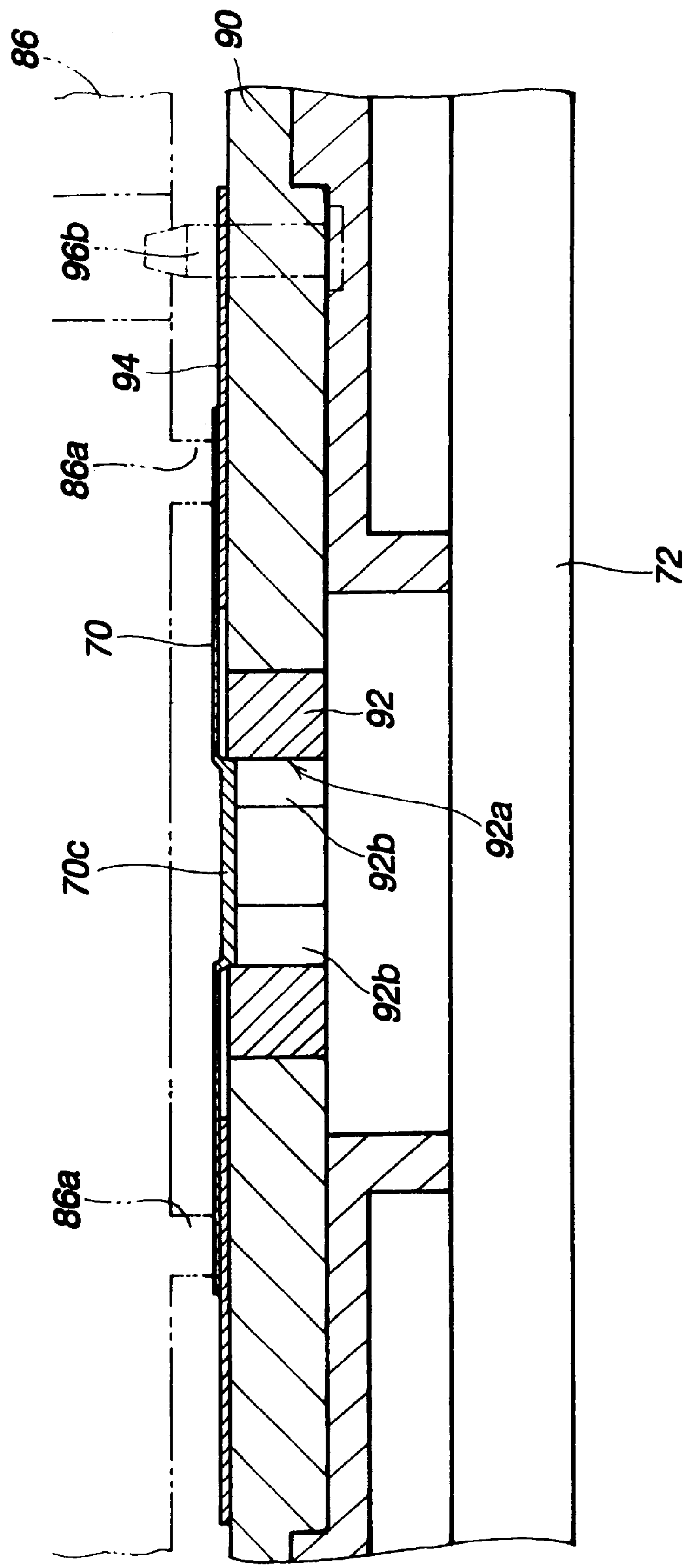
FIG. 16 is an enlarged section of the major part in the embodiment shown in FIG. 13.

Next, while the depression body 86 in the cover body 74 is arranged above the semiconductor element 70 in opposition thereto, the projecting portion 86*a* of the depression body 86 is moved downwardly as shown by two dotted line in FIG. 16, to contact with respective terminal portions 70*da* to 70*dd* of the semiconductor element 70. In conjunction therewith, the stepped portion 76*h* in the cover main body portion 76 are engaged to the peripheral edge portion of the base 72.

Subsequently, respective hook member 88 are pivoted upwardly to approach with each other so that the engaging surface portion 88*a* is respectively engaged with respective recessed portion 76*d* in the cover main body portion 76. By this, the respective terminal portions 70*da* to 70*dd* of the semiconductor element 70 and respective terminal portions 94*da* to 94*dd* of the selectively conducting board 94 are biased by biasing force of the leaf spring 38 to establish electrical communication between respective terminal portions 70*da* to 70*dd* of the semiconductor element 70 and respective terminal portions 94*da* to 94*dd* of the selectively conducting board 94.

Then, under the predetermined circumstance, inspection is performed by supplying a test voltage via the input/output portion 20A of the printed circuit board 20. On the other hand, on the basis of the output signal obtained from the input/output portion 20A, potential defect of the semiconductor element 70*c* can be detected by not shown diagnosis device.

Figure 17:
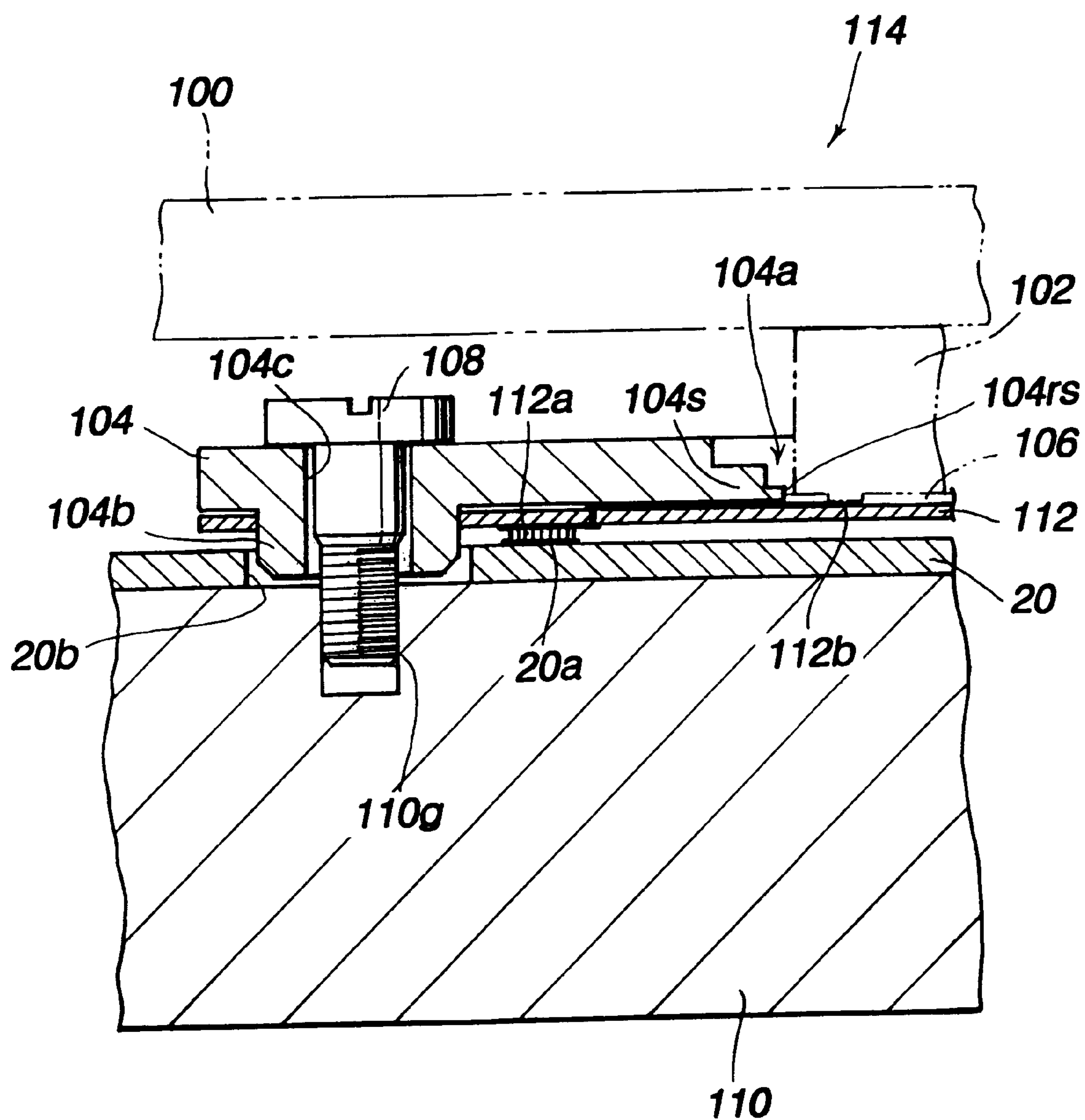
FIG. 17 is a partial section showing the major part of the sixth embodiment of the inspection jig according to the present invention.

FIG. 17 shows a construction of the major portion of the sixth embodiment of the inspection jig according to the present invention.

In the embodiment shown in FIG. 17, the inspection jig is constructed with a printed circuit board 20 mounted on a base 110 formed of aluminum alloy material or PPS (polyphenylene sulfide) resin, being supplied a test voltage and having an input/output portion 20A transmitting an output signal from the semiconductor element 106 as the object under inspection, a plurality of object under inspection receptacle members 104 aligned on a straight line with a predetermined relative distance on the printed circuit board 20 for forming a row, and provided in a plurality of rows, for receiving the semiconductor element 106, depressing portions 114 arranged above respective object under inspection receptacle members 104 arranged in straight line in opposition to respective object under inspection receptacle members 104 for exerting predetermined depression force on the upper surface of the semiconductor element 106 loaded within the object under inspection receptacle members 104, and a support mechanism portion selectively supporting the opposite end portions of the depressing portion 114 on respective base 110.

The semiconductor element 106 as the object under inspection is substantially rectangular shape chip obtained by dividing the wafer, on which a plurality of semiconductor integrated circuits, through dicing process. On the surface of the semiconductor element 106 opposing the selectively conducting board 44 which will be explained later, a plurality of contacts to be connected with the terminal portions of the selective conducting board 44 are formed over the entire periphery.

At the center portion of the positions respectively corresponding to the through holes 20*b* of the printed circuit board 20 in the base 110, female threaded holes 110*g* engaged with male thread portion of the positioning bolts 40 which will be explained later, are provided, as shown in FIG. 17.

A depressing portion 114 is constructed with a depression beam 100 arranged above the object under inspection receptacle members 104 arranged in alignment in opposition thereto, and a depressing body 26 provided on the lower surface portion of the depression beam 100 in opposition to each object under inspection receptacle member 104.

The depression beam 100 is formed of PPS resin or aluminum alloy material, for example. Cut-outs 100*a,* in which respective support members 46 are inserted are provided at both end portions. Also, on the end portion continues with the cut-out portion 100*a,* a tilted surface portion 100*b* having a predetermined gradient is provided.

The depressing body 102 is formed of an elastic material, such as rubber member, and has a contact surface contacting with the upper surface of the semiconductor element 106, at the tip end thereof.

Figure 19:
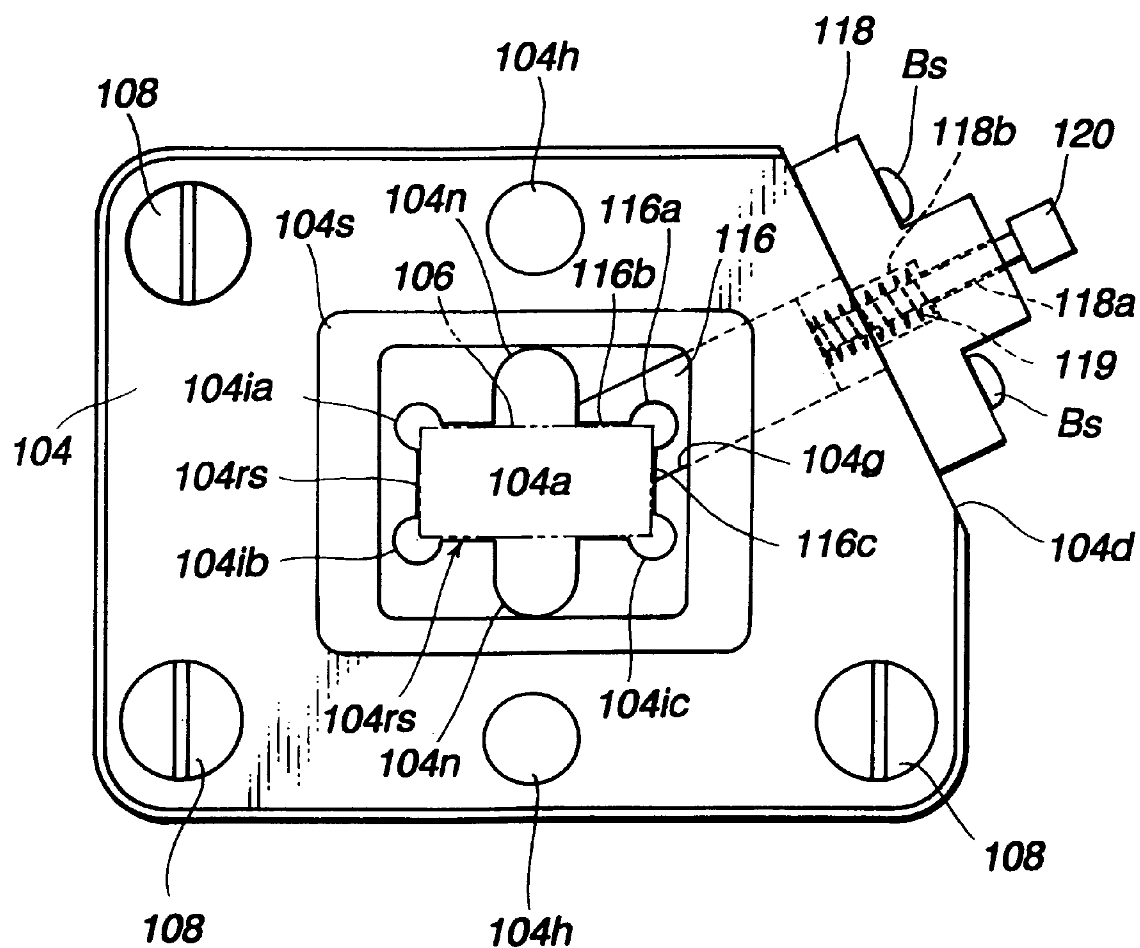
FIG. 19 is a partial plan view showing the major part of the embodiment shown in FIG. 17.

The object under inspection receptacle member 104 is formed of PPS resin, or heat resistant plastic material, such as PES (polyethylene sulfone) resin, PEI (polyethylene imide) resin, for example, and have object under inspection receptacle chambers 104*a* for receiving the semiconductor elements 106 at the center portion, as shown in FIG. 19.

On the peripheral edge portion of the object under inspection receptacle chamber 104*a,* arc-shaped portions 104*ia,* 104*ib* and 104*ic* and a cut-out portion 104*n* are provided for avoiding interference with respective corner portion and the end face of the semiconductor element 106. On the wall surface forming the object under inspection receptacle chamber 104*a,* a reference plane 104*rs,* toward which one of the shorter edges of the semiconductor element 106 is depressed to contact, is formed between the arc-shaped portion 104*ia* and the arc-shaped portion 104*ib.* Also, a reference plane 104*rs,* toward which one of the longer edges of the semiconductor element 106 is depressed to contact, is formed between the arc-shaped portion 104*ib* and the cut-out 104*n.* The reference plane 104*rs* forms a reference for restricting relative position of respective end faces of the semiconductor element 106 relative to the terminal portions 112*a* of the selectively conducting board 112. A distance between the reference plane 104*rs* and the terminal portion 112*a* of the selectively conducting board 112 is set at a predetermined value so that respective contacts of the semiconductor element 106 contacted with the reference plane 104*rs* certainly contact with the terminal portions 112 of the selectively conducting board 112.

Accordingly, even when fluctuation is caused in the semiconductor element 106 in the overall length due to tolerance in manufacturing, respective contacts of the semiconductor element 106 are certainly contacted with the terminal portions 112*a* of the selectively conducting board 112 as long as the distances between the end face of the semiconductor element 106 contacting with the reference plane 104*rs* and respective contacts are maintained.

Furthermore, on the arc-shaped portion 104*ic* side in the peripheral edge portion of the object under inspection receptacle chamber 104*a,* a guide groove 104*g* communicated with the object under inspectionion receptacle chamber 104*a* and, along which a slide member 116 slides. The guide groove 104*g* extends along diagonal line of the semiconductor element 106. One end of the guide groove 104*g* is communicated with the objection under inspection receptacle chamber 104*a.* The other end of the guide groove 104*g* opens to the tilted surface portion 104*d* formed at one corner among four corners of the objection under inspection receptacle member 104.

On one end of the object under inspection receptacle chamber 104*a* in the slider member 116, includes contact surface portions 116*b* and 116*c* respectively contacting with the longer edge and the shorter edge of the semiconductor element 106, and the arc-shaped portion 116*a* connected to the contact surface portion 116*b* and the contact surface portion 116*c.* On the other end of the slide member 116, the other end of the other end of the operation member 120 are connected.

The operation member 120 is inserted to the through hole 118*a* of the block member 30 provided in the tilted surface portion 104*d* and whereby guided. The block member 118 is fixed to the tilted surface portion 104*d* by means of the screws Bs. On the side of the tilted surface portion 104*d* in the block member 118, a recessed portion 118*b* communicated with the through hole 118*a* is provided. Within the recessed portion 118*b*, a coil spring 31 wound around the outer periphery of the operation member 120 is arranged. By this, the slide member 116 is moved toward the inside of the object under inspection receptacle chamber 104*a* by the biasing force of the coil spring 31 together with the operation member 120, in a predetermined distance, e.g. about 1 mm, as shown by two dotted line in FIG. 20. On the other hand, when the operation member 120 is operated in a direction showing by arrow T in FIG. 20, the slide member 116 is placed away from the object under inspection receptacle chamber 104*a* as shown by two dotted line in FIG. 20. By this, the contacting mechanism portion is formed by the block member 118, the slide member 116, the coil spring 119 and the operation member 120.

Figure 20:
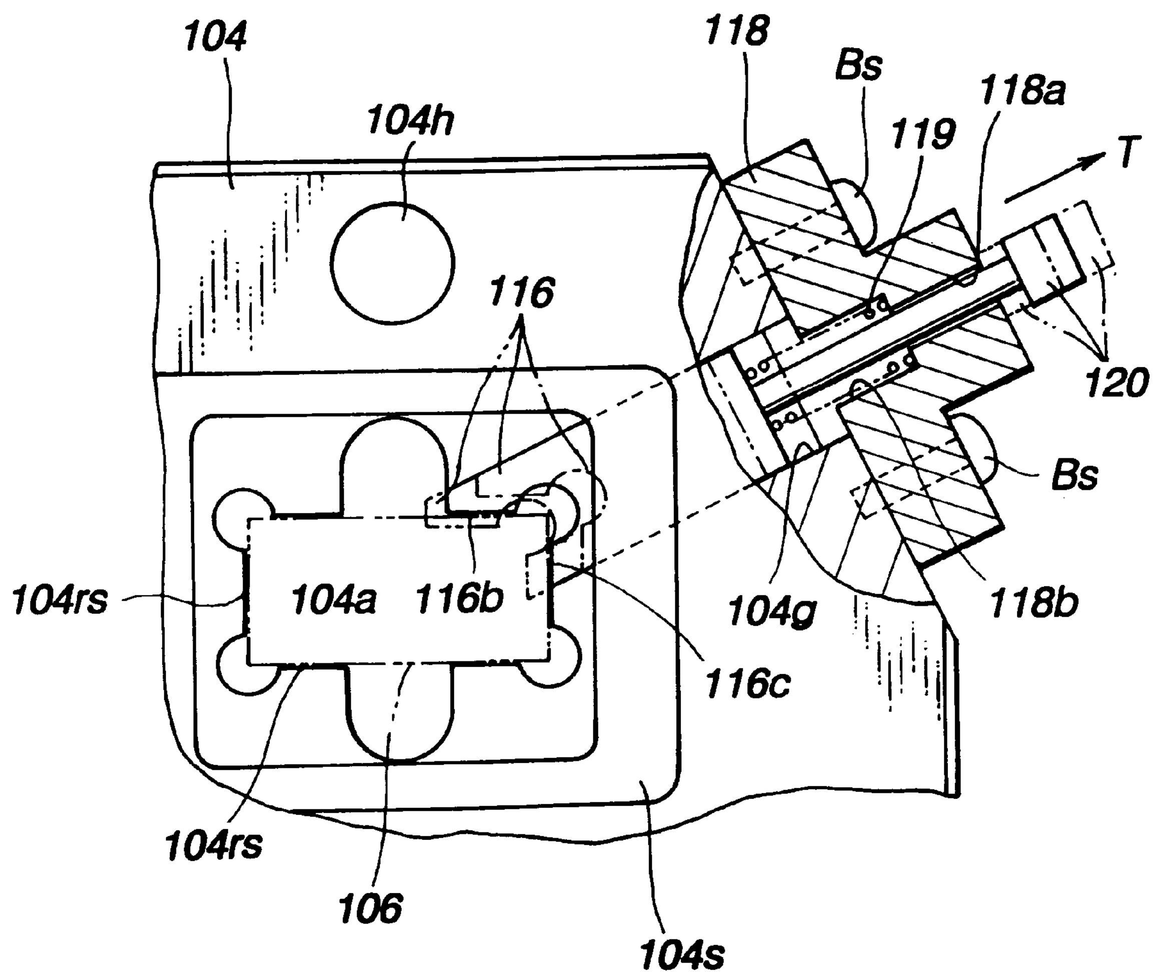
FIG. 20 is an illustration provided for explaining operation in the embodiment shown in FIG. 17.

Also, when the semiconductor element 106 is loaded in the object under inspection receptacle chamber 104*a,* the contact surface portions 116*b* and 116*c* of the slide member 116 are depressed by the biasing force of the coil spring 119 onto respective one of the longer edges and the shorter edges of the semiconductor element 106, as shown by solid line in FIG. 20.

Accordingly, the other of the longer edges and the shorter edges of the semiconductor elements 106 are abutted to respective reference surfaces 104*rs* by the slide member 116 at a predetermined pressure, e.g. 100 g/mm$^2$. By this, even when tolerance is caused in the overall length in the semiconductor element 106 due to tolerance in manufacturing, respective contacts of the semiconductor element 106 are certainly contacted with the terminal portions 112*a* of the selectively conducting board 112 as long as the distances between the end face of the semiconductor element 106 contacting with the reference planes 104*rs* and respective contacts are maintained.

On the surrounding of the object under inspection receptacle chamber 104*a,* step portion 164*s* surrounding the object under inspection receptacle chamber is provided. And, on the upper end surface portion of object under inspection receptacle chamber 104*a,* a hole 104*h* having a predetermined depth, is provided.

On the surrounding of the object under inspection receptacle chamber 104*a,* projecting portions 104*b* to be inserted into respective through holes 20*b* of the printed circuit board 20 for performign positioning of the selectively conducting board 112 relative to the printed circuit board 20 is provided as shown in FIG. 17. Within each projecting portion 104*b,* a through hole 104*c,* through which the positioning bolt 40 is inserted, is provided respectively.

By this, the receptacle under inspection member 104 is fixed to the base 110 by engaging the positioning bolt 108 with the threaded hole 110*s* of the base 110 through the through hole 104*c*.

Figure 18:
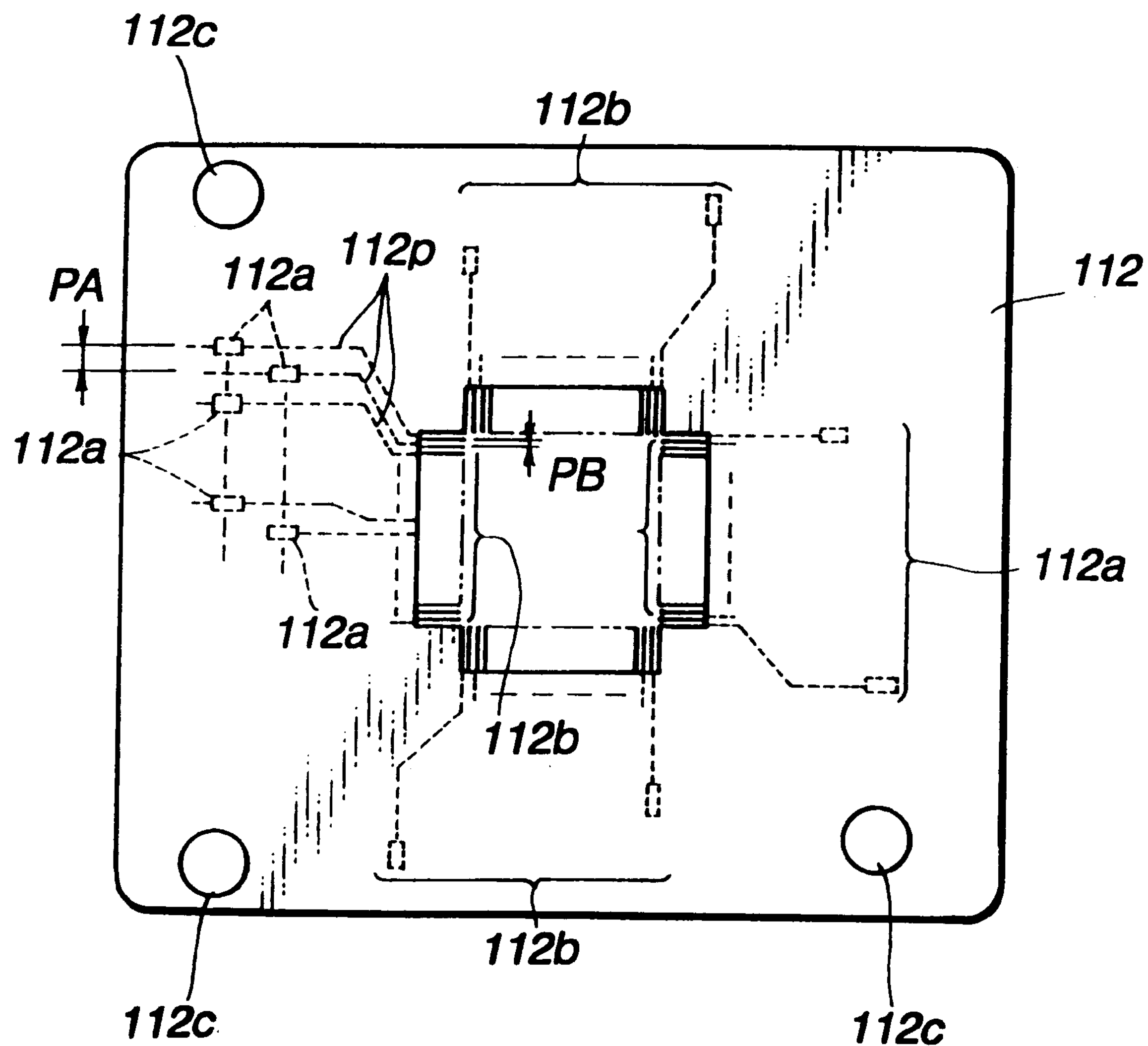
FIG. 18 is a plan view showing a selectively conducting board to be employed in the embodiment shown in FIG. 17.

As shown in FIG. 18, in the selectively conducting board 112, terminal portion 112*b* formed of a composite conductive material, such as a composite material consisted of silicone rubber and metal particle, corresponding to respective terminal portions of the semiconductor element 106 received within the object under inspection receptacle chamber 104*a,* is provided. As the composite conductive material, anisotropic conductive rubber is employed. Anisotropic conductive rubber is a material having conductivity in the thickness direction and no conductivity in a direction along the plane. As anisotropic conductive rubber, any of a dispersion type, in which the conductive portions are dispersed within a rubber having insulative property, and a localized type, in which the conductive portions are locally concentrated, may be employed.

By forming the terminal portion 112*b* by such anisotropic conductive rubber, respective terminal portions of the semiconductor element 106 and the terminal portion 112*b* are connected by surface contact to avoid contact failure. In conjunction therewith, damaging by contacting with the terminal portion 112*b* can be avoided.

As shown in FIG. 18, at the position in the selectively conducting board 112 opposing to the contacts 20*a* in the printed circuit board 20, terminals 112*a* are provided respectively. The terminal portions 112*a* are formed of the anisotropic conductive rubber similarly to the terminal portion 112*b*. Each terminal portion 112*a* are connected to each terminal portion 112*b* by respective conductors 112*p*.

On the other hand, an interval PA between the terminal portions 112*a* is set to be greater than the interval PB of the terminal portions 112*b* for difference of length of each conductors 112*p*. Furthermore, the terminal portions 112*a* are arranged alternately in two rows to permit setting the interval PA sufficiently long. By this, the selectively conducting board 112 can be adapted for the semiconductor element which has terminals arranged in high density.

On three corners in the selectively conductive board 112, through holes 112*c,* in which the projecting portions 104*b* of the object under inspection receptacle member 104 are inserted, are provided corresponding to the projecting portions 104*b* of the object under inspection receptacle member 104.

It should be noted that while the selectively conducting board 112 is provided for each one of the object under inspection receptacle member 104 in the foregoing embodiment, the present invention should not be limited to the shown construction. Namely, for example, the selectively conducting board 112 may be provided over a plurality of the object under inspection receptacle members 104.

With the construction set forth above, upon performing inspection for the semiconductor element 106, at first, the semiconductor element 106 is loaded within the object under inspection receptacle chamber 104*a* of the object under inspection receptacle member 104 in a condition positioned by the slide member 116. At this time, each terminal portion of the semiconductor element 106 is in contact with each terminal portion 112*b* of the selectively conducting board 112.

Next, under the condition where not shown each support member and the locking lever are inserted within respective cut-out portions 100*a* of the depression beam 100, the depression body 102 is abutted onto the upper surface of the semiconductor element 106 with mutually matching not shown positioning markings respectively provided on the depression beam 100 and the object under inspection receptacle member 104. At this time, the position of the depression beam 100 becomes higher than that of the upper end face of each support member depending upon the elastic force of the depression body 102.

Subsequently, by pivoting respective locking levers along the tilted surface portion of the depression beam 100, the depression beam 100 is lowered to abut the contact surface of the depression body 102 onto the upper surface of the semiconductor element 106 under pressure developed by the elastic force of the depression body 102. By this, respective terminal portions 112*b* of the selectively conducting board 112 are conducted.

In this circumstance, the test voltage is supplied via the input/output portion 20A of the printed circuit board 20 for performing inspection. On the other hand, on the basis of the output signal obtained from the input/output portion 20A, potential defect of the semiconductor element 106 can be detected by not shown diagnosis device.

Figure 21:
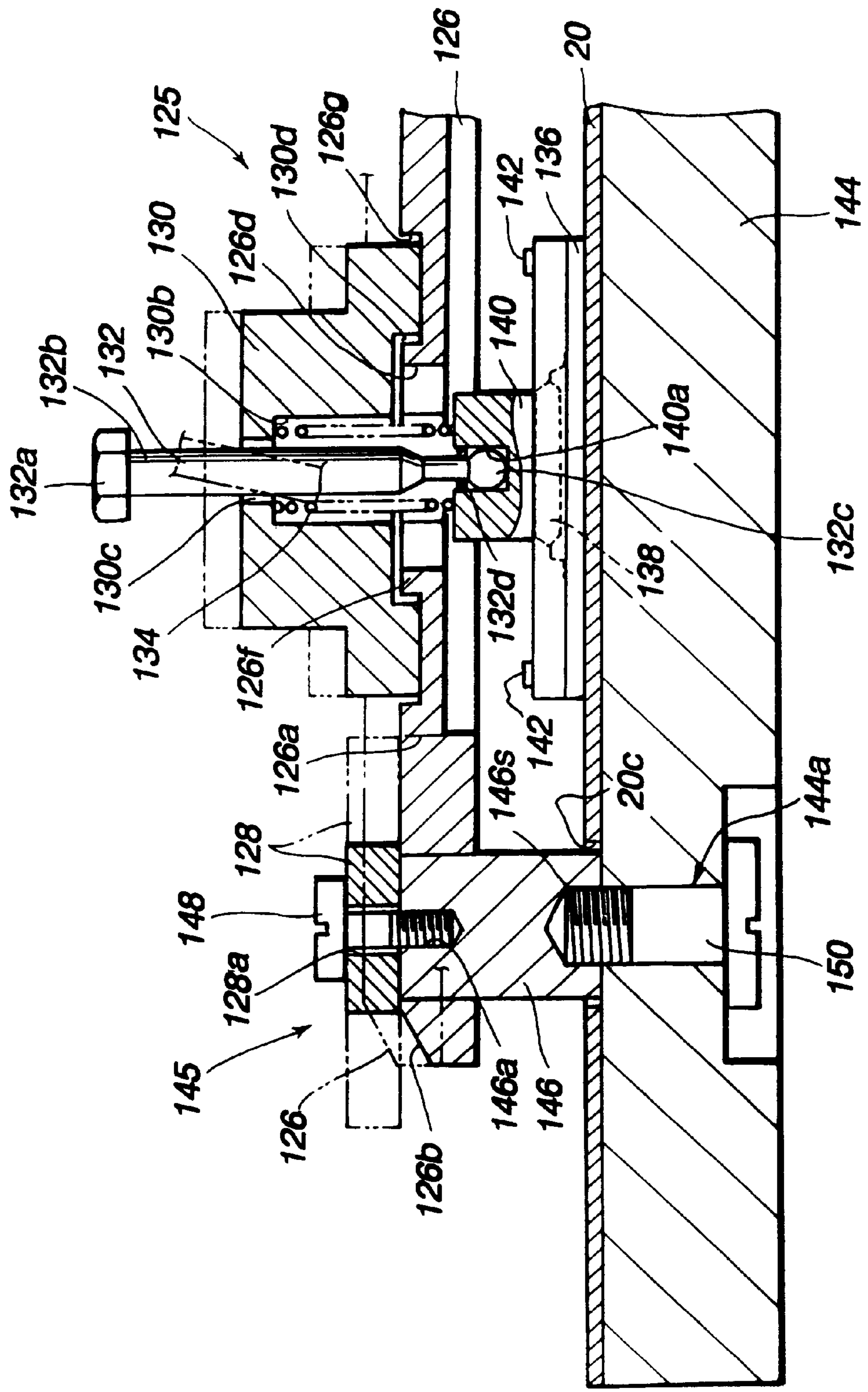
FIG. 21 is a partial section showing the major part of the seventh embodiment of the inspection jig according to the present invention.

FIG. 21 shows a construction of the major part of the seventh embodiment of the inspection jig according to the present invention. In the embodiment shown in FIG. 21, the inspection jig is constructed with the printed circuit board 20 mounted on a base 144 formed of aluminum alloy material or PPS (polyphenylene sulfide) resin, being supplied a test voltage and having an input/output portion 20A transmitting an output signal from the semiconductor element 138 as the object under inspection, a plurality of object under inspection receptacle members 136 aligned on a straight line with a predetermined relative distance on the printed circuit board 20 for forming a row, and provided in a plurality of rows, depressing mechanism portion 125 as depressing member arranged above respective object under inspection receptacle members 136 arranged on a plurality of straight lines in opposition to respective object under inspection receptacle members 136 for exerting predetermined depression force on the upper surface of the semiconductor element 138 loaded within the object under inspection receptacle members 136, and a support mechanism portion 145 selectively supporting the opposite end portions of the depressing mechanism portion 125 on respective base 144.

Figure 22:
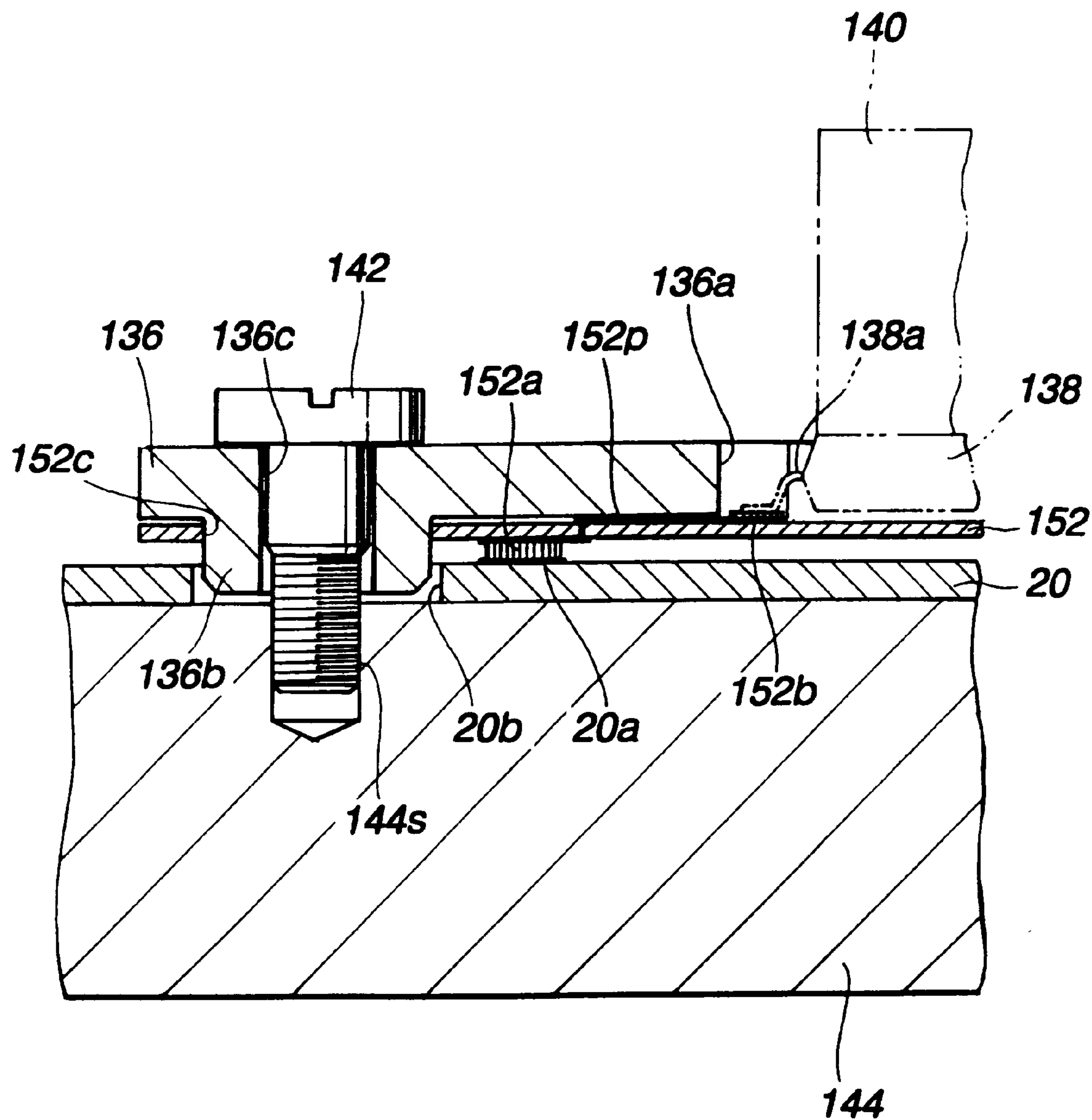
FIG. 22 is a partial section showing the major part of the embodiment shown in FIG. 21.

At the center portion of the positions respectively corresponding to the through holes 20*b* of the printed circuit board 20 in the base 144, female threaded holes 144*g* engaged with male thread portion of the positioning bolts 142 which will be explained later, are provided as shown in FIG. 22.

On the other hand, at the positions in the base 144 respectively corresponding to both end portions of the depression mechanism portion 125, a support member 146 extending through the through hole 20*c* of the printed circuit board 20 is fixed by threadingly engaging a fastening bolt 150 with female threaded hole 146*s,* as shown in FIG. 21. On the upper end of the support member 146, a locking lever 128 selectively locking the depression beam 22 in the depression mechanism portion 125, is provided. The engaging lever 128 is pivotably supported on the upper end portion of the support member 146 by inserting the screw 148 into the through hole 128*a* thereof and engaging with the threaded hole 146*a* at the upper end of the support member 146, as shown by the two dotted line.

The object under inspection receptacle member 136 is formed of PPS resin, or heat resistant plastic material, such as PES (polyethylene sulfone) resin, PEI (polyethylene imide) resin, for example, and have object under inspection receptacle chambers 136*a* for receiving the semiconductor elements 138 at the center portion, as shown in FIG. 22. In the object under inspection receptacle chamber 136*a,* a wall surface portion 136*w* restricting respective positions of both side portions in respective terminal groups of the semiconductor element 138, is provided. On the circumference of the object under inspection receptacle chamber 136*a,* projecting portions 136*b* to be inserted into respective of the through holes 20*b* of the printed circuit board 20 for positioning the object under inspection receptacle member 136 and the selectively conducting board 152, are provided. Within each projecting portion 136*b,* through holes 136*c,* in which the position bolts 142 are inserted, are provided, respectively. By this, the object under inspection receptacle member 136 is fixed on the base 144 by engaging the positioning bolts 142 with the threaded holes 144*s* of the base 144 through holes 136*c*.

Figure 23:
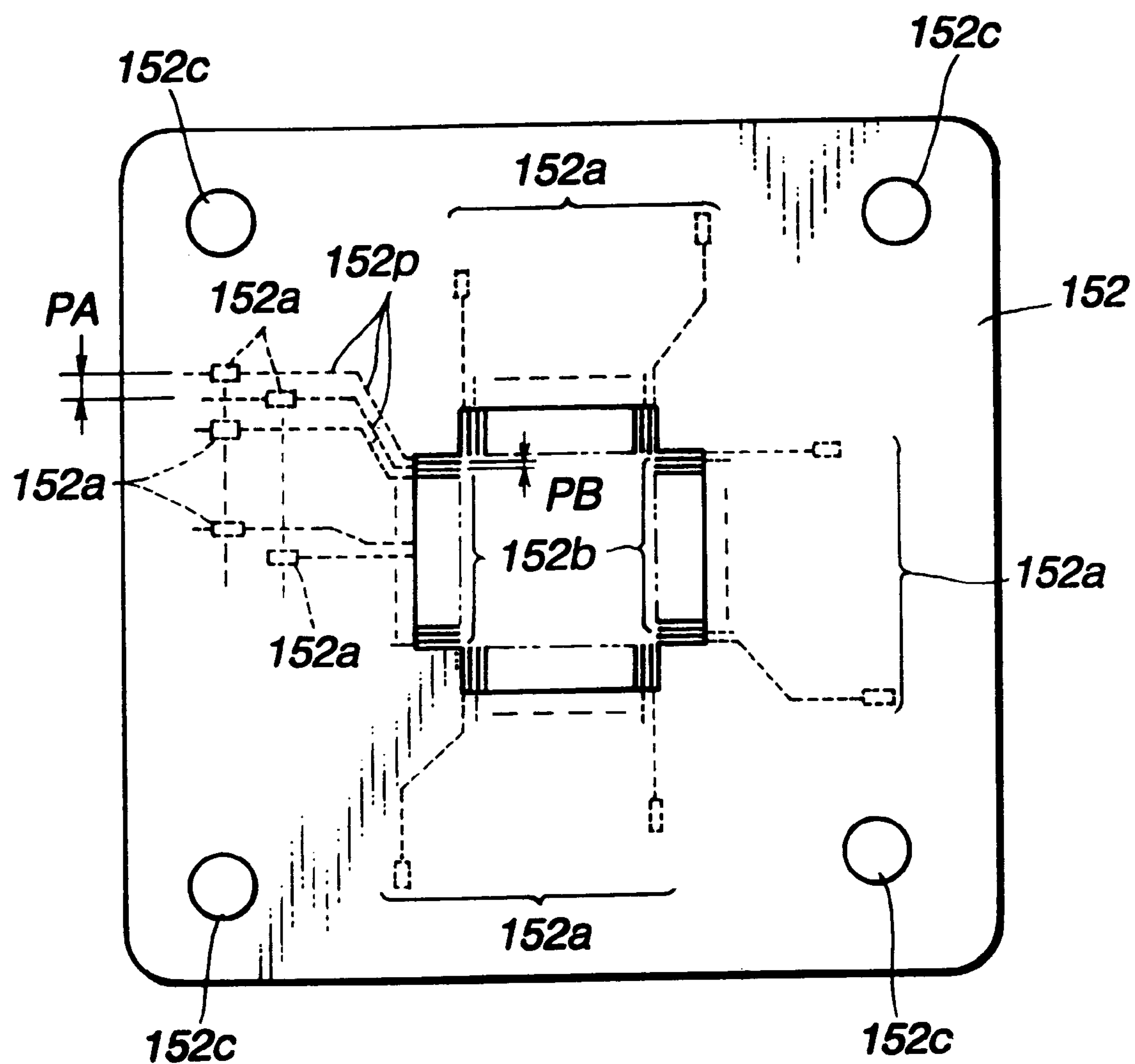
FIG. 23 is a plan view showing the selectively conducting board employed in the embodiment shown in FIG. 21.

As shown in FIG. 23, in the selectively conducting board 152, terminal portion 152*a* formed of a composite conductive material, such as a composite material consisted of silicone rubber and metal particle, corresponding to respective terminal portions of the semiconductor element 138 received within the object under inspection receptacle chamber 136*a,* is provided. As the composite material, anisotropic conductive rubber is employed. Anisotropic conductive rubber is a material having conductivity in the thickness direction and no conductivity in a direction along the plane. As anisotropic conductive rubber, any of a dispersion type, in which the conductive portions are dispersed within a rubber having insulative property, and a localized type, in which the conductive portions are locally concentrated, may be employed.

By forming the terminal portion 152*a* by such anisotropic conductive rubber, respective terminal portions of the semiconductor element 138 and the terminal portion 152*a* are connected by surface contact to avoid contact failure. In conjunction therewith, damaging by contacting with the terminal portion 152*a* can be avoided.

At the position in the selectively conducting board 152 opposing to the contacts 20*a* in the printed circuit board 20, terminal portions 152*a* are provided respectively. The terminal portions 152*a* are formed of the anisotropic conductive rubber similarly to the terminal portion 152*b*. Each terminal portion 152*a* are connected to each terminal portion 152*b* by respective conductors 152*p*. On the other hand, an interval PA between the terminal portions 152*a* is set to be greater than the interval PB of the terminal portions 152*b* for difference of length of each conductors 152*p*. Furthermore, the terminal portions 152*a* are arranged alternately in two rows to permit setting the interval PA sufficiently long. By this, the selectively conducting board 152 can be adapted for the semiconductor element which has terminals arranged in high density.

Furthermore, on the four corners in the selectively conducting board 152, through holes 152*c,* to which the projecting portions 136*b* of the object under inspection receptacle member 136 are provided corresponding to the projecting portions 136*b* of the object under inspection receptacle member 136.

It should be noted that while one selectively conducting board 152 is provided for each object under inspection receptacle member 136 in the foregoing example, the present invention is not limited to the shown embodiment. For instance, the selectively conducting board 152 may be provided bridging over a plurality of the selectively conducting boards 136.

The depression mechanism portion 125 is constructed with a depression beam 126 arrange in alignment and located above the object under inspection receptacle member 136 in opposition thereto, a housing member 130 provided on the upper surface portion of the depression beam 126 in opposition per respective object under inspection receptacle member 136, a block member 140 having a contact surface contacting with the upper surface of the semiconductor element 138 loaded in the object under inspection receptacle member 136, support members 28 inserted within the housing member 130 and rockably connected with the block member 140 and a coil spring 134 arranged between the outer peripheral surface of the support member 28 and the inner peripheral surface of the housing member 130 for biasing under predetermined pressure depressing the block member 140 downwardly, namely toward the upper surface of the semiconductor element 138.

The depression beam 126 is provided with cut-out portions 126*a,* in which support member 146 is inserted on both ends respectively. On the other hand, on the end portion continues with the cut-out portion 126*a,* a tilted surface portion 126*b* having a predetermined gradient, is provided. At a portion on the upper surface portion of the depression beams 126 opposing the object under inspection receptacle member 136, a recessed portion 126*g* of substantially quadrangular shape and fixed to the lower end portion of the housing member 130 is formed. On the inside of the projecting portion 126*f* forming the inner peripheral wall portion of the recessed portion 126*g,* an opening portion 126*d,* through which the support member 28 extends, is provided.

Inside of the housing member 130 includes s through hole 130*c* provided on the upper end portion, a large diameter portion 130*d,* in which the projecting portion 126*f* of the depression beam 126 is inserted and a small diameter portion 130*b* communicating the through hole 130*c* and the large diameter portion 130*d.*

Within the through hole 130*c* and the small diameter portion 130*b,* the column member 132 is inserted. On the other hand, between the outer peripheral surface of the column member 132 and the small diameter portion 130*b,* a coil spring 134 is disposed.

The column member 132 is constructed with a substantially hexagonal head portion 132*a* and a stem portion 132*b* connected to the head portion 132*a* at one end. On the other end portion of the stem portion 132*b,* the block member 140 having a recessed portion 140*a* connected to spherical connecting portion 132*c* through the snap ring 132*d* is provided. Between the outer periphery of the stem portion 132*b* of the column member 132 and the peripheral edge portion of the through hole 130*c,* a predetermined gap is formed. By this, the support member 132 can be driven as shown by the two dotted line in FIG. 21.

On the other hand, the block member 140 is connected to the stem portion 132*b* for rocking motion relative to the connecting portion 132*c* under the condition where the block member 140 is depressed toward the upper surface of the semiconductor element 138 by the biasing force of the coil spring 134.

With the construction set forth above, upon performing inspection for the semiconductor element 138, at first, the semiconductor element 138 is loaded within the object under inspection receptacle chamber 136*a* of the object under inspection receptacle member 136 in the condition where the terminal positions 138*a* thereof are positioned by the wall surface portion 136*w*, as shown in FIG. 22. At this time, each terminal portion 138*a* of the semiconductor element 138 is in contact with each terminal portion 152*b* of the selectively conducting board 152.

Next, under the condition where each support member 146 and the locking lever 128 are inserted within respective cut-out portions 126*a* of the depression beam 126 from above, the lower end surface of the block beam 140 as the contact portion is arranged in contact with the upper surface of the semiconductor element 138 with mutually matching the not shown positioning marking respectively provided on the depression beam 126 and the object under inspection receptacle member 136. At this time, the position of the depression beam 126 becomes higher than the upper end portion of respective support member 146 depending upon the biasing force of the coil spring 134, as shown by two dotted line in FIG. 21.

Subsequently, by pivoting respective locking levers 128 along the tilted surface portion 126*b* of the depression beam 126 as shown by solid line being FIG. 21, the block member 140 exerted the biasing force of the coil spring 134, comes into contact with the upper surface of the semiconductor element 138.

Figure 24:
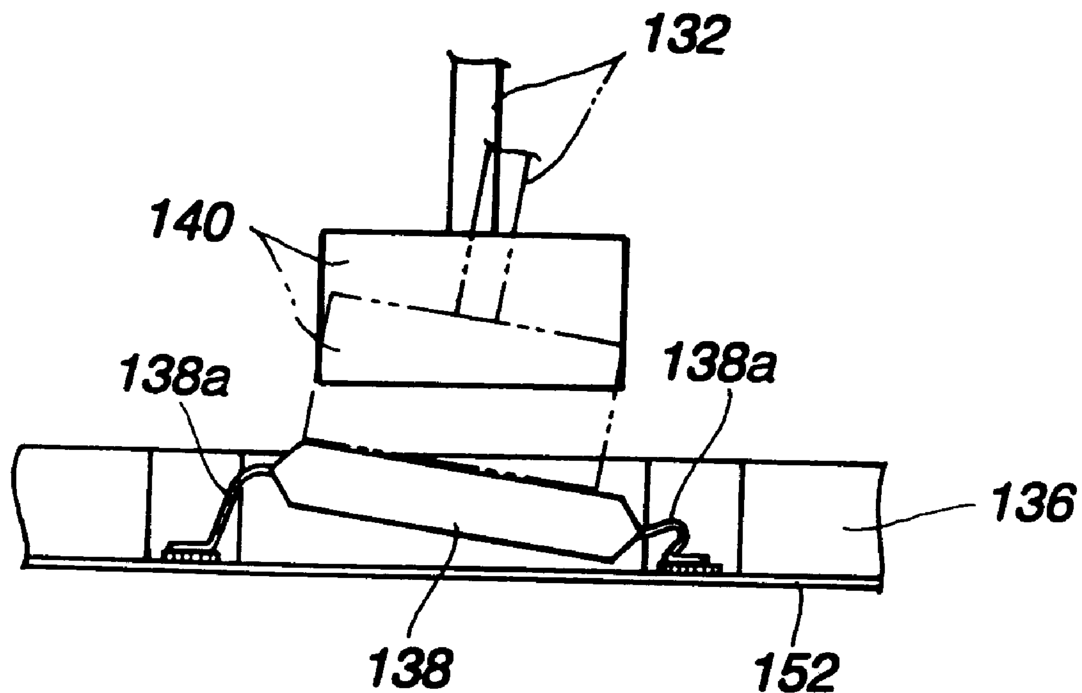
FIG. 24 is an illustration provided for explanation of operation showing in the embodiment shown in FIG. 21.
Figure 25:
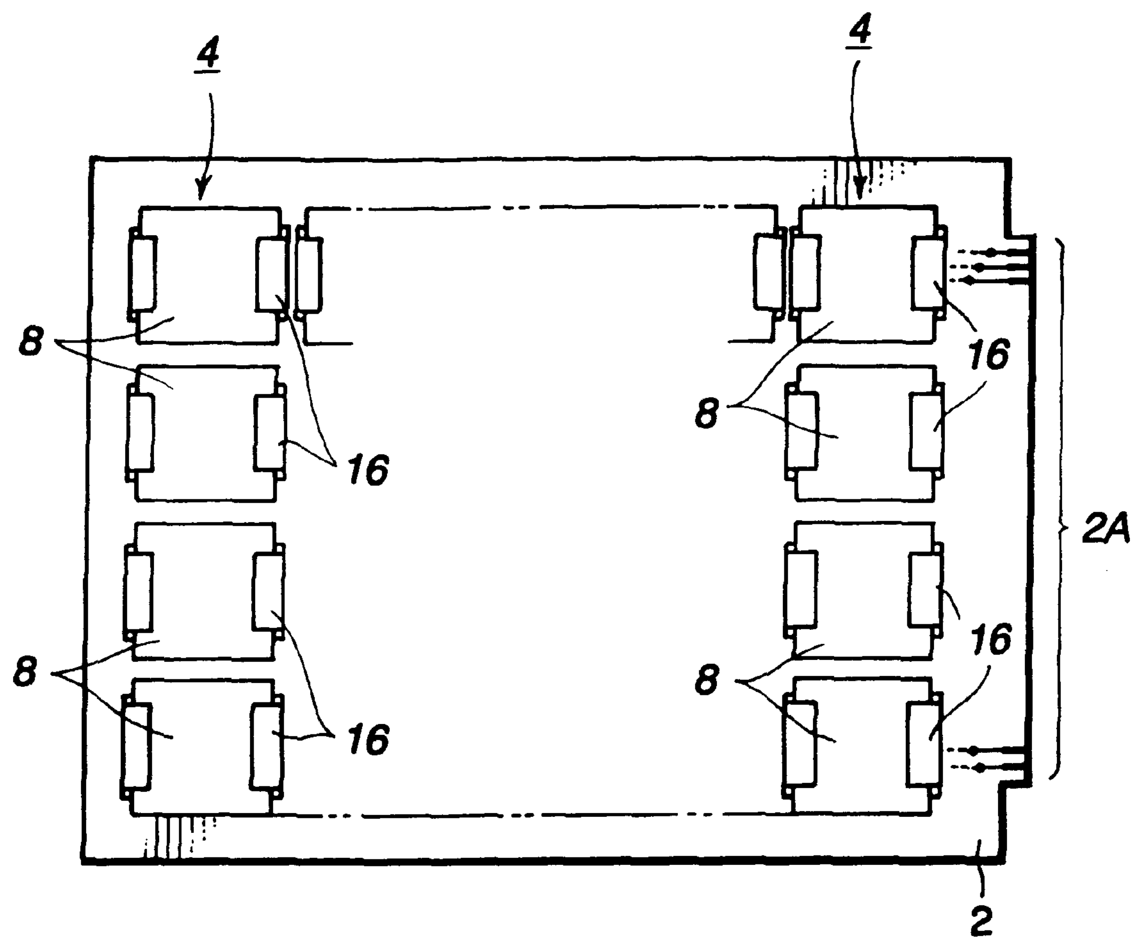
FIG. 25 is a plan view showing general construction of the conventional inspection jig.
Figure 26:
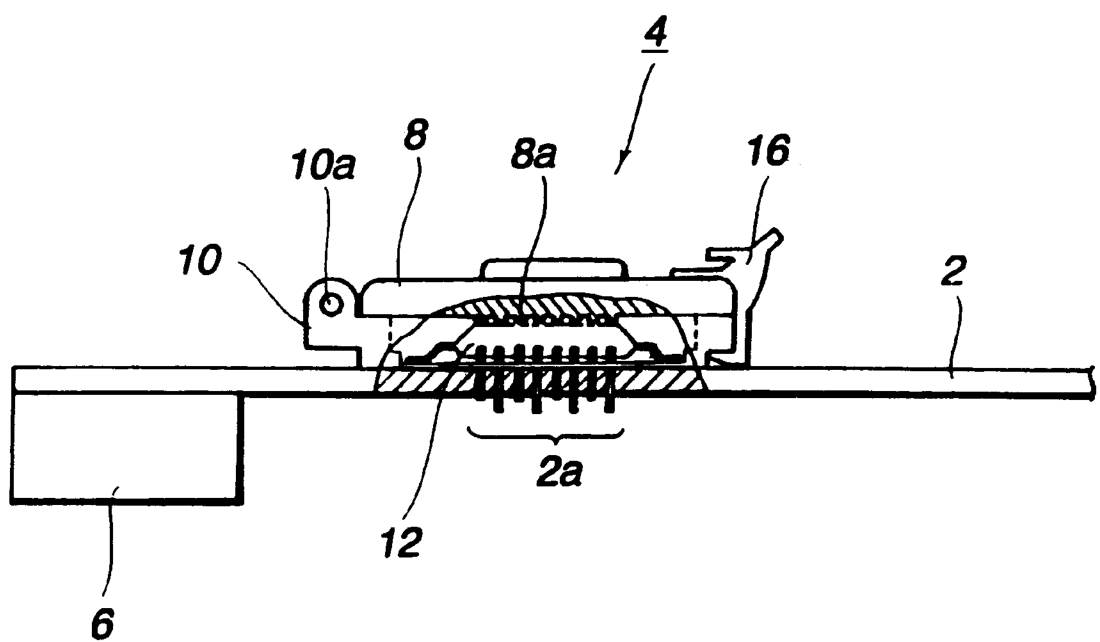
FIG. 26 is a section showing the inspection jig shown in FIG. 25.

At this time, as shown in FIG. 24, when one of the terminal portions 138*a* among mutually opposing terminal portions in the semiconductor element 138 is bent in an angle greater than or equal to a predetermined angle, the lower end surfaces of the column member 132 and the block member 140 are rocked over the upper surface of the semiconductor element 138 to come into contact with upper surface of the semiconductor element 138.

Accordingly, the depression force may act on the upper surface of the semiconductor element 138 becomes uniform. Therefore, the depression force to be exerted on respective terminals 152*b* of the selectively conducting board 152 via each terminal portions 138*a* of the semiconductor element 138, is applied uniformly. As a result, the terminal portions 152*b* and 152*a* and the contacts 20*a* of the printed circuit board 20 becomes conductive state.

Then, under the predetermined circumstance. the test voltage is supplied via the input/output portion 20. On the other hand, on the basis of the output signal obtained from the input/output portion 20A, the potential defect of the semiconductor element can be detected by the not shown diagnosis system.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An inspection jig comprising:

a board including a contact electrically connected to a terminal of an object under inspection which has an internal electronic circuit, and an input/output portion inputting an input signal and outputting an output signal;

a depression member having a contact portion contacting with a depressed surface portion in said object under inspection with a predetermined pressure for contacting said contact of said board onto said terminal of said object under inspection loaded on said board;

a support member supporting said depression member for permitting the contact portion of said depression member to move toward and away from said depressed surface portion along a direction substantially perpendicular to said depressed surface portion of said object under inspection which is arranged on said board; and a slide member having both ends of said depression member opposing said contact portion supported movably in a direction substantially parallel to said depressed surface portion in said object under inspection and selectively placing said contact portion between a depression condition and a depression released condition relative to the depressed surface portion in said object under inspection.

2. An inspection jig as claimed in claim 1, which further comprises a selectively conducting board arranged between the contact of said board and the terminal of said object under inspection having a connecting portion provided corresponding to the contact of said board, and selectively conducting said terminal and said contact via said connecting portion.

* * * * *